United States Patent
Kiuchi et al.

(10) Patent No.: US 7,433,019 B2
(45) Date of Patent: Oct. 7, 2008

(54) EXPOSURE APPARATUS AND DEVICE MANUFACTURING METHOD

(75) Inventors: Tohru Kiuchi, Higashi-Kurume (JP); Toshihiro Miyake, Urayasu (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/325,332

(22) Filed: Jan. 5, 2006

(65) Prior Publication Data

US 2006/0209278 A1 Sep. 21, 2006

Related U.S. Application Data

(63) Continuation of application No. PCT/JP2004/009995, filed on Jul. 7, 2004.

(30) Foreign Application Priority Data

| Jul. 9, 2003 | (JP) | ............................. 2003-272614 |
| Feb. 20, 2004 | (JP) | ............................. 2004-044801 |

(51) Int. Cl.
*G03B 27/54* (2006.01)
(52) U.S. Cl. .......................................... 355/67; 378/34
(58) Field of Classification Search ................... 355/30, 355/53, 67, 71; 430/5, 22, 30, 311, 322; 378/34, 35
See application file for complete search history.

(56) References Cited

U.S. PATENT DOCUMENTS

| 4,346,164 | A | | 8/1982 | Tabarelli et al. |
| 4,480,910 | A | | 11/1984 | Takanashi et al. |
| 4,907,021 | A | | 3/1990 | Yabu |
| 5,528,118 | A | | 6/1996 | Lee |
| 5,610,683 | A | * | 3/1997 | Takahashi ..................... 355/53 |
| 5,623,853 | A | | 4/1997 | Novak et al. |
| 5,715,039 | A | | 2/1998 | Fukuda et al. |
| 5,825,043 | A | | 10/1998 | Suwa |
| 5,874,820 | A | | 2/1999 | Lee |
| 5,969,441 | A | | 10/1999 | Loopstra et al. |
| 6,191,429 | B1 | | 2/2001 | Suwa |
| 6,522,390 | B2 | | 2/2003 | Suzuki et al. |
| 6,639,740 | B1 | | 10/2003 | Spinali |
| 6,853,443 | B2 | * | 2/2005 | Nishi .......................... 355/72 |
| 6,930,842 | B2 | | 8/2005 | Shibazaki |
| 2002/0104453 | A1 | | 8/2002 | Lee et al. |
| 2002/0163741 | A1 | | 11/2002 | Shibazaki |
| 2004/0165159 | A1 | | 8/2004 | Lof et al. |
| 2005/0030498 | A1 | * | 2/2005 | Mulkens ....................... 355/30 |
| 2006/0232756 | A1 | * | 10/2006 | Lof et al. ...................... 355/53 |
| 2007/0139631 | A1 | * | 6/2007 | Novak et al. .................. 355/53 |

FOREIGN PATENT DOCUMENTS

| DE | DD 221 563 A1 | 4/1985 |
| DE | DD 224 448 A1 | 7/1985 |

(Continued)

*Primary Examiner*—Della J. Rutledge
(74) *Attorney, Agent, or Firm*—Oliff & Berridge, PLC

(57) ABSTRACT

An exposure apparatus projects a pattern image onto a substrate via a projection optical system and a liquid, and the projection optical system has an optical member that comes into contact with the liquid and an optical group arranged between the optical member and a reticle. A holding mechanism that holds the optical member and the optical group holds the optical member so that it is movable relative to the optical group.

49 Claims, 15 Drawing Sheets

FOREIGN PATENT DOCUMENTS

| | | |
|---|---|---|
| EP | 605103 B1 | 7/1994 |
| JP | A 57-117238 | 7/1982 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-65603 | 3/1992 |
| JP | A 4-305915 | 10/1992 |
| JP | A 4-305917 | 10/1992 |
| JP | A 5-62877 | 3/1993 |
| JP | A 6-53120 | 2/1994 |
| JP | A 6-124873 | 5/1994 |
| JP | A 6-168866 | 6/1994 |
| JP | A 6-188169 | 7/1994 |
| JP | A 7-176468 | 7/1995 |
| JP | A 7-220990 | 8/1995 |
| JP | A 8-37149 | 2/1996 |
| JP | A 8-166475 | 6/1996 |
| JP | A 8-316125 | 11/1996 |
| JP | A 8-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-16816 | 1/1999 |
| JP | A 11-176727 | 7/1999 |
| JP | A 11-195602 | 7/1999 |
| JP | A 2000-58436 | 2/2000 |
| JP | A 2000-100909 | 4/2000 |
| JP | A 2000-505958 | 5/2000 |
| JP | A-2000-216084 | 8/2000 |
| JP | A 2001-307982 | 11/2001 |
| JP | A 2002-14005 | 1/2002 |
| JP | A-2002-305140 | 10/2002 |
| JP | A-2003-59806 | 2/2003 |
| JP | A-2003-124095 | 4/2003 |
| WO | WO 1999/49504 A1 | 9/1999 |
| WO | WO 2004/019128 A2 | 3/2004 |

* cited by examiner

EXPOSURE APPARATUS AND DEVICE MANUFACTURING METHOD

CROSS-REFERENCE TO RELATED APPLICATION

This is a Continuation Application of International Application No. PCT/JP2004/009995, filed Jul. 7, 2004, which claims priority to Japanese Patent Application Nos. 2003-272614 (filed on Jul. 9, 2003) and 2004-044801 (filed on Feb. 20, 2004). The contents of the aforementioned application are incorporated herein by reference.

BACKGROUND OF THE INVENTION

1. Field of the Invention

The present invention relates to an exposure apparatus that exposes a substrate in a status in which the space between the projection optical system and the substrate has been filled with a liquid, and to a device manufacturing method that uses this exposure apparatus.

2. Description of Related Art

A semiconductor device or a liquid crystal display device is manufactured by the technique known as photolithography, in which a pattern formed on a mask or reticle (hereunder called "reticle") is transferred onto a substrate such as a wafer or a glass plate. The exposure apparatus used in this photolithography process has a reticle stage that supports a reticle and a substrate stage that supports a substrate, and it transfers a reticle pattern to a substrate via a projection optical system while sequentially moving the reticle stage and the substrate stage. In recent years, higher resolutions for projection optical systems have been in demand to deal with further high integration of device patterns. The resolution of the projection optical system becomes higher the shorter the exposure wavelength used and the larger the numerical aperture of the projection optical system. For this reason, the exposure wavelengths used in the exposure apparatus are becoming shorter each year, and the numerical apertures of projection optical systems are also increasing. In addition, the mainstream exposure wavelength at preset is the 248 nm of a KrF excimer laser, but a shorter wavelength, the 193 nm of an ArF excimer laser, is also coming into practical application. In addition, when exposure is performed, the depth of focus (DOF) is also important in the same way as the resolution. The resolution Re and the depth of focus δ are expressed by the respective equations below.

$$Re = k_1 \cdot \lambda / NA, \quad (1)$$

$$\delta = \pm k_2 \cdot \lambda / NA^2, \quad (2)$$

Here, λ is the exposure wavelength NA is the numerical aperture of the projection optical system, and $k_1$ and $k_2$ are process coefficients. Based on Equation (1) and Equation (2), it is apparent that when the exposure wavelength λ is made shorter to increase the numerical aperture NA in order to increase the resolution Re, the depth of focus δ becomes narrower.

When the depth of focus δ becomes too narrow, it becomes difficult to match the substrate surface to the image plane of the projection optical system, and there is concern that the focus margin during the exposure operation will be inadequate. Therefore, the liquid immersion method disclosed in PCT International Publication No. WO99/49504, for example, has been proposed as a method of effectively shortening the exposure wavelength and widening the depth of focus. This liquid immersion method fills the space between the lower surface of the projection optical system and the substrate surface with a liquid such as water or an organic solvent, and it uses the fact that the wavelength of the exposure light in liquid becomes 1/n in air (n is normally approximately 1.2 to 1.6 at the refractive index of the liquid) to increase the resolution as it expands the depth of focus by approximately n times.

In any case, in a status in which the space between the substrate surface and the end face of the optical member that is most on the substrate side of the projection optical system is filled with liquid, vibration produced by the movement of the substrate stage that supports the substrate is transmitted to the optical member at the terminating end thereof via the liquid, and there is a possibility that the pattern image projected onto the substrate via the projection optical system and the liquid will deteriorate.

Furthermore, in the aforementioned prior art, in order to form a liquid immersion region, a nozzle member that has a liquid supply port and a liquid recovery port is used to perform liquid supply and recovery, but when liquid penetrates into the gap between the nozzle member and the projection optical system, there is a possibility of nonconformities such as rust being produced on the barrel that holds the optical members that comprise the projection optical system or the optical members dissolving. It is also conceivable that liquid will penetrate to the interior of the barrel, and there is a possibility of the above nonconformities occurring in that case as well.

In addition, due to the effects of the liquid that has penetrated, there is a possibility of a nonconformity occurring whereby, for example, the optical member that is most on the image plane side in the projection optical system deforms or vibrates, albeit slightly, leading to deterioration of exposure accuracy and measurement accuracy.

SUMMARY OF THE INVENTION

The present invention was devised taking such circumstances into account, and its purpose is to provide an exposure apparatus that is able to restrict pattern image deterioration when the space between the projection optical system and the substrate is filled with liquid and exposure processing is performed, and to provide a device manufacturing method that uses this exposure apparatus.

In order to solve the aforementioned problems, the present invention adopts the following configuration corresponding to FIG. 1 to FIG. 10 shown in the embodiments.

The exposure apparatus of the present invention is an exposure apparatus that has a projection optical system that includes an optical member that comes into contact with a liquid and an optical group arranged between said optical member and a pattern and that exposes a substrate by projecting a pattern image onto the substrate via the projection optical system and the liquid. The exposure apparatus includes a holding mechanism that holds the optical member and the optical group. The holding mechanism holds the optical member in such a way that it is movable relative to the optical group.

Through the present invention, the optical member of the projection optical system that comes into contact with the liquid (namely, the front lens) is held in such a way that it is movable relative to the optical group arranged with that optical member and the pattern, so the vibration that is transferred to the optical member is absorbed by that optical member moving. Therefore, transmission of the vibration of the optical member to the optical group can be prevented.

In addition, the purpose of the present invention is to provide an exposure apparatus that is able to prevent the penetration of liquid into the projection optical system to maintain high exposure accuracy and measurement accuracy, as well as a device manufacturing method that uses that exposure apparatus.

In order to solve the above problem, the present invention employs the following configuration corresponding to FIG. 10 to FIG. 16, which show an embodiment.

The exposure apparatus of the present invention is an exposure apparatus that exposes a substrate by forming a liquid immersion region of a liquid on the image plane side of a projection optical system, and projecting a pattern onto said substrate via said projection optical system and said liquid. The exposure apparatus includes: a ring-shaped member that is provided so as to surround the side surface of a optical member or the side surface of a holding member and has at least one of either a liquid supply port or a liquid recovery port, said optical member being among a plurality of optical members of said projection optical system and coming into contact with said liquid, said holding member holding said optical member, and a first seal member that blocks penetration of liquid between said optical member or the side surface of said holding member and said ring-shaped member.

Through the present invention, by providing a first seal member, it is possible to prevent the penetration of liquid into the space between the optical member or the holding member and the ring-shaped member. Therefore, it is possible to prevent nonconformities such as rust being produced on the holding member and the optical member dissolving. In addition, since liquid does not penetrate into the space between the optical member or the holding member and the ring-shaped member, it is possible to prevent occurrences such as vibration or deformation of the optical member resulting from liquid that has penetrated. Therefore, it is possible to perform exposure processing and measurement processing via the liquid with good accuracy.

The exposure apparatus of the present invention is an exposure apparatus that exposes a substrate by forming a liquid immersion region of a liquid on the image plane side of a projection optical system, and projecting a pattern onto said substrate via said projection optical system and said liquid. The exposure apparatus includes; a holding member that holds a optical member being among a plurality of optical members of said projection optical system and coming into contact with said liquid; and a seal member that blocks a flow of gas between said optical member and said holding member.

Through the present invention, by providing a seal member, it is possible to prevent the flow of gas between the exterior and the interior space of the holding member that holds the plurality of optical members that comprise the projection optical system. Therefore, even if the configuration is such that the interior space of the holding member is filled with a prescribed gas, it is possible to prevent the penetration of exterior gas and liquid into that interior space and to maintain the desired environment in the interior space.

The device manufacturing method of the preset invention uses the exposure apparatus described above. Through the present invention, it is possible to maintain high exposure accuracy and measurement accuracy, so it is possible to provide a device that is able to exhibit the desired performance.

DETAILED DESCRIPTION OF THE INVENTION

Figure 1:
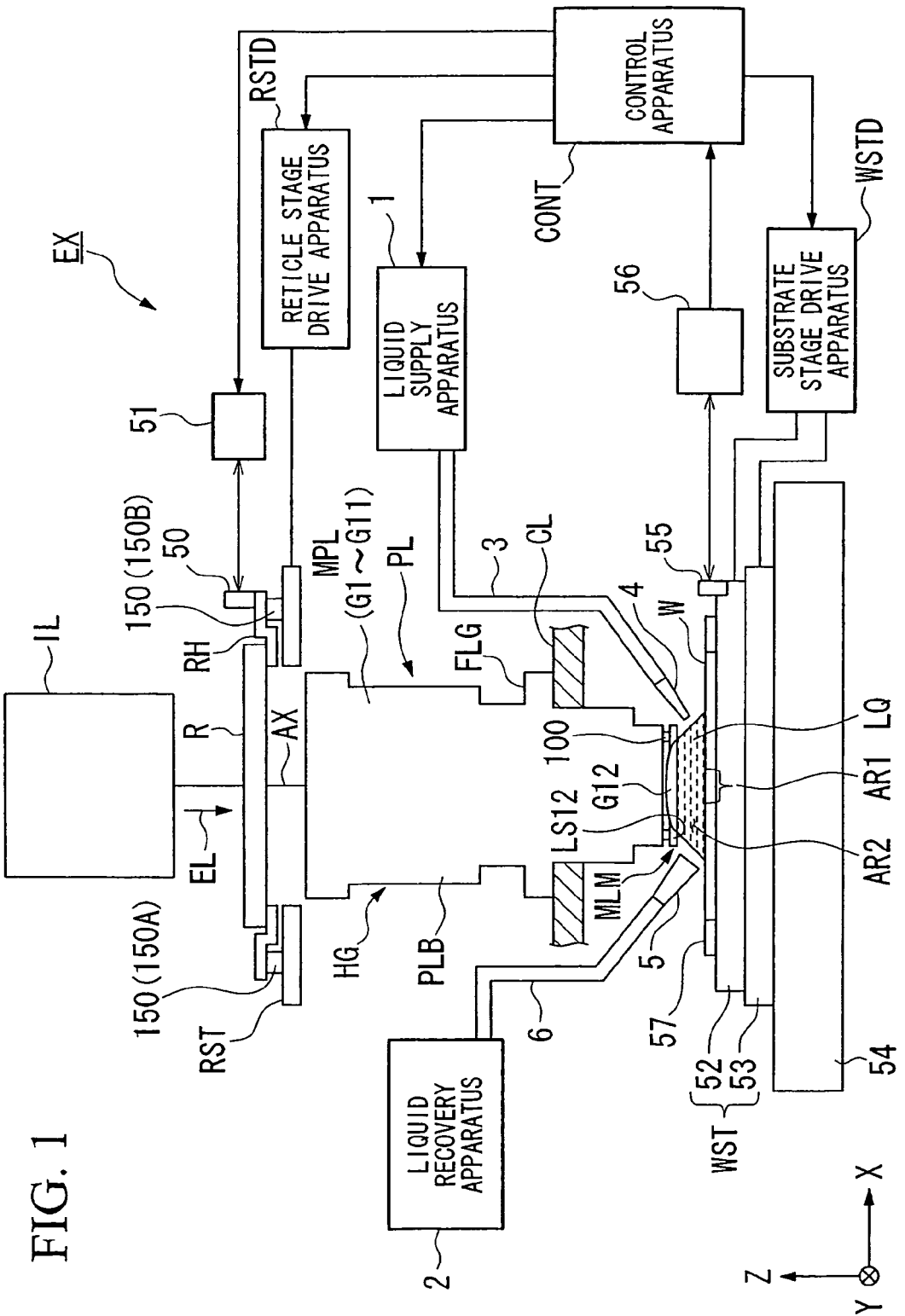
FIG. 1 is a schematic block diagram that shows an embodiment of the exposure apply of the present invention.

The exposure and device manufacturing method of the present invention will be explained below while referring to the drawings.

First Embodiment

FIG. 1 is a schematic block diagram that shows an embodiment of the exposure apparatus of the present invention.

In FIG. 1, the exposure apparatus EX comprises a reticle stage RST that supports a reticle, a substrate stage WST that supports a substrate W, an illumination optical system IL that uses exposure light EL to illuminate the reticle R that is supported by the reticle stage RST, a projection optical system PL that projection exposes the pattern image of the reticle illuminated by the exposure light EL onto the substrate W supported on the substrate stage WST, and a control apparatus CONT that comprehensively controls operation of the entire exposure apparatus EX.

Here in the present embodiment, an explanation will be given which uses as an example the case of a scanning exposure apparatus (a so-called scanning stepper) that, as the exposure apparatus EX synchronously moves the reticle R and the substrate W in a direction (reverse direction) that is mutually different from the scanning direction while exposing the pattern formed on the reticle R onto the substrate W. In the following explanation, the direction that matches the optical axis AX of the projection optical system PL is the Z axis direction, the synchronous movement direction (scanning direction) of the reticle R and the substrate W within a plane perpendicular to the Z axis direction is the X axis direction, and the direction (non-scanning direction) perpendicular to the Z axis direction and the X axis direction is the Y axis direction. In addition, the rotation (tilting) directions around the X axis, Y axis and Z axis are the θX, θY and θZ directions respectively. Note that the "substrate" mentioned here includes those in which a resist has been coated onto a semiconductor wafer or a glass wafer.

The exposure apparatus EX of the pet invention is a liquid immersion exposure apparatus that applies the liquid immersion method to effectively shorten the exposure wavelength to improve resolution while effectively widening the depth of focus, and it comprises a liquid supply apparatus 1 that supplies liquid LQ onto the substrate W and a liquid recovery apparatus 2 that recovers the liquid LQ on the substrate W. The exposure apparatus EX forms a liquid immersion region AR2 on a portion on the substrate W that contains the projection region AR1 of the projection optical system PL by means of the liquid LQ supplied from the liquid supply apparatus 1 while at least the pattern image of the reticle R is being transferred onto the substrate W. Specifically, the exposure apparatus EX adopts a local liquid immersion configuration (Local Liquid Filling) that fills the space between the optical member (optical element) G12 of the terminating end portion of the projection optical system PL and the surface of the substrate W with liquid LQ, and it exposes the substrate W by projecting the pattern image of the reticle R onto the substrate W via the projection optical system PL and the liquid LQ between this projection optical system PL and the substrate W.

The illumination optical system IL uses exposure light EL to illuminate a reticle R that is supported on the reticle stage RST, and it has an exposure light source, an optical integrator that evens out the illumination intensity of the luminous flux that has exited from the exposure light source, a condenser lens that focuses the exposure light EL from the optical integrator a relay lens system, and a variable field diaphragm that sets the illumination region on the reticle R resulting from the exposure light EL in a slit shape. The prescribed illumination region on the reticle R is illuminated by exposure light EL with an even illumination intensity distribution by means of the illumination optical system IL. Used as the exposure light EL that is irradiated from the illumination optical system IL are, for example, deep ultraviolet light (DUV light) such as ultraviolet band bright lines (g-rays, h-rays, i-rays) irradiated from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser light is used.

Here, in the present embodiment, demineralized water is used for the liquid LQ. Demineralized water can be passed through not only by ArF excimer laser light but deep ultraviolet light DUV light) such as ultraviolet band bright lines (g-rays, h-rays, i-rays) irradiated from a mercury lamp and KrF excimer laser light (wavelength of 248 nm).

The reticle stage RST uses a reticle holder RH to support a reticle R on which a circuit pattern that is the base image is formed, and it is capable of two dimensional movement within a plane perpendicular to the optical axis AX of the projection optical system PL, that is, within the XY plane, and microrotation in the θZ direction. The reticle stage RST is driven by a reticle stage drive apparatus RSTD such as a linear motor.

The reticle stage drive apparatus RSTD is controlled by a control apparatus CONT. A movable mirror 50 is provided on the reticle holder RH (or on the reticle stage RST). In addition, a laser interferometer 51 is provided at a position that opposes the movable mirror 50. The position in the two-dimensional direction and the angle of rotation in the θZ direction (depending on the case, also the microrotation angles in the θX and θY directions) of the reticle R on the reticle stage RST are measured in real time by a laser interferometer 51, and the measurement results are output to a control apparatus CONT. The control apparatus CONT performs positioning of the reticle R that is supported on the reticle stage RST by driving the reticle stage drive apparatus RSTD based on the measurement results of the laser interferometer 51. In addition, a plurality of actuators 150 (150A to 150C) is provided between the reticle holder RH, which holds the reticle R, and the reticle stage RST. Through the driving of the actuators 150, the reticle holder RH that holds the reticle R is able to move in tilt directions that include the Z axis direction and the θX and θY directions.

The projection optical system PL projection exposes the pattern of the reticle R onto a substrate W at a prescribed projection magnification β. In the present embodiment, the projection optical system PL is a reduction system in which the projection magnification β is ¼ or ⅕, for example. Note that the projection optical system PL may be either a magnification system or an element systems The projection optical system PL comprises an optical member G12 that is arranged on the terminating end side (substrate W side) of the projection optical system PL and comes into contact with the liquid LQ, and an optical group MPL that has a plurality of optical elements G1 to G11 arranged between optical element G12 and the reticle R that has the pattern. Note that, in the present embodiment, optical element G12 is one plane-convex lens element. In addition, the plurality of optical elements G1 to G12 that comprise the projection optical system PL are held by a holding mechanism HG. The holding mechanism HG comprises a barrel (second holding member) PLB, which holds the optical group MPL, and a lens holding portion MLM, which holds lens element G12. The lens holding portion MLM comprises a lens cell (first holding member) LS12 that holds lens element G12, and a connection mechanism 100 that softly connects the lens cell LS12 to the barrel PLB. The connection mechanism 100 comprises flexures (100A to 100C) as the elastic members discussed below. The lens element G12 held in the lens cell LS12 is movable relative to the optical group MPL held by the barrel PLB by means of the connection mechanism 100.

A flange portion FLG is provided at the outer circumference portion of the barrel PLB, and the projection optical system PL is supported by a column (the main unit body of the exposure apparatus) CL via the flange portion FLG. The optical elements G1 to G12 are formed of fluorite or quartz, and the curved sure of some of the optical elements are aspherically polished. Particularly when lens element G12 is formed of fluorite, this fluorite as-is becomes corroded by the water over a long period of time, so it is coated with an appropriate thin film to increase affinity. Through this, it is possible to cause the liquid LQ to closely adhere to newly the entire surface of the liquid contact surface of lens element G12, and it is possible to reliably fill the optical path between the lens element G12 and the substrate W with the liquid LQ. Note that the lens element G12 may also be quartz that has a high affinity with water. In addition, in the case where hydrophilic (lyophilic) treatment is performed by coating the liquid contact surface 2a of the lens element G12 to increase the affinity with the liquid LQ, in a dry status in which water has been removed from the liquid immersion region AR2, a special film structure (for example, a film that increases in temperature when an electric field is applied, and the molecular arrangement changes, and a slight current flows) that causes the water content to quickly escape from the liquid contact surface of the lens element G12 may also be used.

The substrate stage WST supports a substrate W, and it comprises a Z stage 52 that supports the substrate W via a substrate holder and an XY stage 53 that supports the Z stage 52. The substrate sage WST that includes the Z stage 52 and the XY stage 53 is supported by a stage base 54. The substrate stage WST is driven by a substrate stage drive apparatus WSTD such as a linear motor. The substrate stage drive apparatus WSTD is controlled by a control apparatus CONT. The position (focus position) of the substrate W supported on the Z stage 52 in the Z as direction and the position in the θX and θY directions are controlled by driving the Z stage 52. In addition, the position of the substrate W in the XY direction (position in a direction that is effectively parallel with the image plane of the projection optical system PL) is controlled by driving the XY stage 53. Specifically, the Z stage 52 controls the focus position and the tilt angle of the substrate W to make the surface of the substrate W match with the image plane of the projection optical system PL using an autofocus system or an autoleveling system, and the XY stage 53 performs positioning of the substrate W in the X axis direction and the Y axis direction. Note that it goes without saying that Z stage and the XY stage should be provided as a unit.

A movable minor 55 is provided on the substrate stage WST (Z stage 52). A laser interferometer 56 is provided at a position that opposes the movable mirror 55. The position in the two-dimensional direction and the angle of rotation of the substrate W on the substrate stage WST are measured in real time by the laser interferometer 56, and the measurement results are output to a control apparatus CONT. The control apparatus CONT performs positioning of the substrate W supported on the substrate stage WST by driving the substrate stage drive apparatus WSTD based on the measurement results of the laser interferometer 56.

In addition, an auxiliary plate 57 that surrounds the substrate W is provided on the substrate stage WST (Z stage 52). The auxiliary plate 57 has a plane that is nearly the same height as the surface of the sure W supported on the substrate holder. Here, there is a gap of approximately 0.1 to 1.0 mm between the edge of the substrate W and the auxiliary plate 57, but even in the case where there is almost no flow of the liquid LQ into that gap due to the surface tension of the liquid LQ, and the vicinity of the periphery of the substrate W is expose it is possible to hold the liquid LQ below lens element G12 of the projection optical system PL by means of the auxiliary plate 57.

The exposure apparatus EX comprises a liquid supply apparatus that supplies liquid LQ onto the substrate W and a liquid recovery apparatus 2 that recovers the liquid LQ on the substrate W. The liquid supply mechanism 1 is for supplying the liquid LQ onto the substrate W and filling the space between lens element G12 of the terminating end portion of the projection optical system PL and the substrate W to form a liquid immersion region AR2, and it comprises a tank that accommodates the liquid LQ, a pressurization pump, and a temperature adjustment apparatus that adjusts the temperature of the supplied liquid LQ. One end portion of a supply tube 3 is connected to the liquid supply apparatus 1, and a supply nozzle 4 is connected to the other end portion of the supply tube 3. The liquid supply apparatus 1 supplies liquid LQ onto the substrate W via a supply tube 3 and a supply nozzle 4.

The liquid recovery apparatus 2 comprises a suction pump and a tank that accommodates the recovered liquid LQ.

One end portion of a recovery tube 6 is connected to the liquid recovery apparatus 2, and a recovery nozzle 5 is connected to the other end portion of the recovery tube 6. The liquid recovery apparatus 2 recovers the liquid LQ on the substrate W via the recovery nozzle 5 and the recovery tube 6. When the liquid immersion region AR2 is formed, the control apparatus CONT drives the liquid supply apparatus 1 and supplies the prescribed amount of liquid LQ per unit time via a supply tube 3 and a supply nozzle 4 as it drives the liquid recovery apparatus 2 and recovers the presented amount of liquid LQ per unit time via recovery nozzle 5 and recovery tube 6. Through this, a liquid immersion region AR2 of the liquid LQ is formed between the substrate W and the lens element G12 of the terminating end portion of the projection optical system PL.

Figure 2:
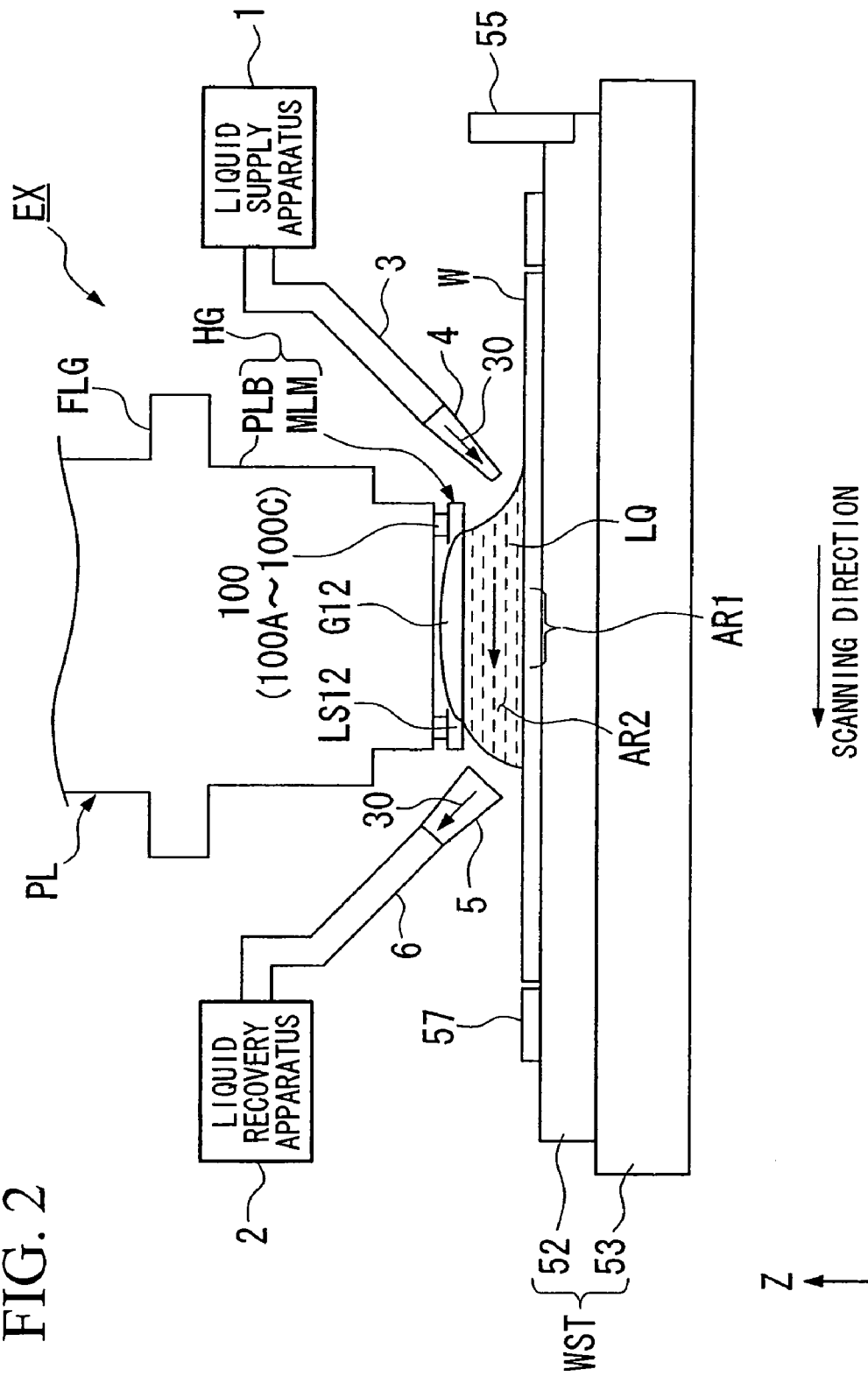
FIG. 2 is an enlarged view of the vicinity of the front end portion of the projection optical system.
Figure 3:
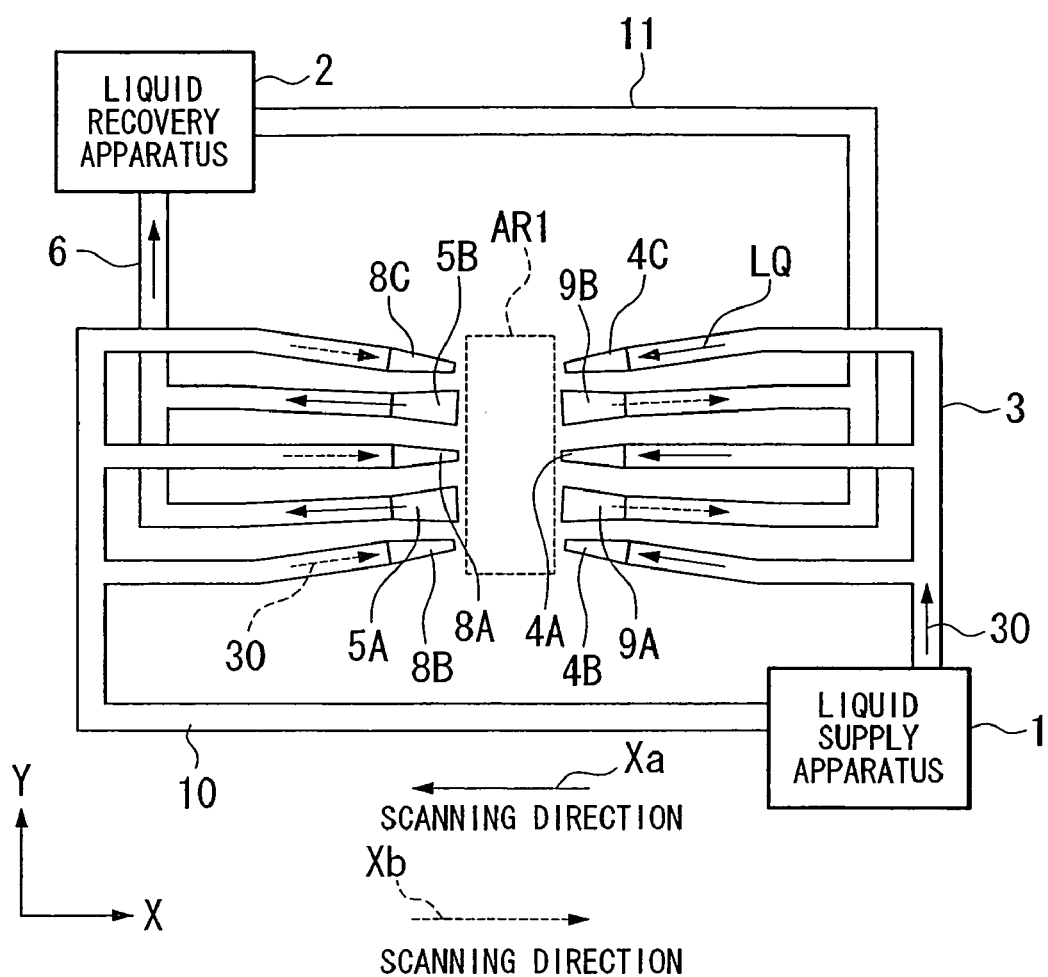
FIG. 3 is a drawing that shows the positional relationship between the projection region of the projection optical system, the liquid supply apparatus and the liquid recovery apparatus.

FIG. 2 is a front view that shows the lower portion of the projection optical system PL of the exposure apparatus EX, the liquid supply apparatus 1 and the liquid recovery apparatus 2, FIG. 3 is a drawing that shows the positional relationship between the projection region AR1 of the projection optical system PL and the supply nozzle 4 and the recovery nozzle 5. The projection region AR1 of the projection optical system PL is a long, narrow rectangular shape (slit shape) in the Y axis direction, and three supply nozzles 4A to 4C are arranged on the +X side and two recovery nozzles 5A, 5B are arranged on the −X side so as to interpose that projection region AR1 in the X axis direction. Also, the supply nozzles 4A to 4C are connected to the liquid supply apparatus 1 via a supply tube 3, and the recovery nozzles 5A, 5B are connected to the liquid recovery apparatus 2 via a recovery tube 4. In addition, supply nozzles 8A to 8C and recovery nozzles 9A and 9B are arranged at a position at which supply nozzles 4A to 4C and recovery nozzles 5A and 5B are rotated nearly 180° about the optical axis of the projection optical system PL. Supply nozzles 4A to 4C and recovery nozzles 9A and 9B are alternately arranged in the Y axis direction, supply nozzles 8A to 8C and recovery nozzles 5A and 5B are alternately arranged in the Y axis direction, supply nozzles 8A to 8C are connected to the liquid supply apparatus 1 via a supply tube 10, and recovery nozzles 9A and 9B are connected to the liquid recovery apparatus 2 via a recovery tube 11.

During scanning exposure, the pattern image of a portion of the reticle R is projected on the projection region AR1, and in synchronization with the reticle R moving in the −X direction (or the +X direction) at a velocity V with respect to the projection optical system PL, the substrate W moves in the +X direction (or the −X direction) at a velocity β·V (where β is the projection magnification) by means of the XY stage 53. After exposure to one shot region has been completed, the next shot region moves to the scanning start position by means of the stepping of the substrate W, and thereafter the exposure process for the respective shot regions is sequentially performed by a step and scan system. In the present embodiment, it is set to cause the liquid LQ to flow in the same direction as the movement direction of the substrate W in parallel with the movement direction of the substrate W. That is, if the substrate W is moved in the scanning direction (−X direction) shown by arrow Xa (see FIG. 3) to perform scanning exposure, supply tube 3, supply nozzles 4A to 4C, recovery tube 6, and recovery nozzles 5A and 5B are used, and liquid LQ supply and recovery are performed by a liquid supply apparatus 1 and a liquid recovery apparatus 2. Specifically, when the substrate W is moved in the −X direction, the liquid LQ is supplied in the space between the projection optical system PL and the substrate W via supply tube 3 and supply nozzle 4 (4A to 4C) as the liquid LQ is recovered by the liquid recovery apparatus 2 via recovery nozzle 5 (5A, 5B) and recovery tube 6, and the liquid LQ flows in the −X direction to fill the space between the lens element G12 and the substrate W. On the other hand, in the case where the substrate W is moved in the scanning direction (+X direction) shown by arrow Xb to perform scanning exposure, supply tube 10, supply nozzles gate 8A to 8C, recovery tube 11, and recovery nozzles 9A and 9B are used to supply and recover the liquid LQ by means of the liquid supply apparatus 1 and the liquid recovery apparatus 2. Specifically, when the substrate moves in the +X direction, liquid LQ is supplied in the space between the projection optical system PL and the substrate W from the liquid supply apparatus 1 via supply tube 10 and supply nozzle 8 (8A to 8C) while the liquid LQ is recovered by the liquid recovery apparatus 2 via recovery nozzle 9 (9A, 9B) and recovery tube 11, and the liquid LQ is caused to flow in the +X direction so that the space between lens element G12 and the substrate W is filled. In this case, the liquid LQ supplied from the liquid supply apparatus 1, for example, via supply nozzle 4 flows so that it is pulled into the space between lens element G12 and the substrate W in conjunction with the movement of the substrate W in the −X direction, so the liquid LQ is easily supplied between lens element G12 and the substrate W even if the supply energy of the liquid supply apparatus 1 is small. Also, by switching the direction in which the liquid LQ flows according to the scanning direction, even in the case where the substrate W is scanned in either the +X direction and the −X direction, it is possible to fill the space between the lens element G12 and the substrate W with liquid LQ, and high resolution and broad depth of focus are possible.

Figure 4:
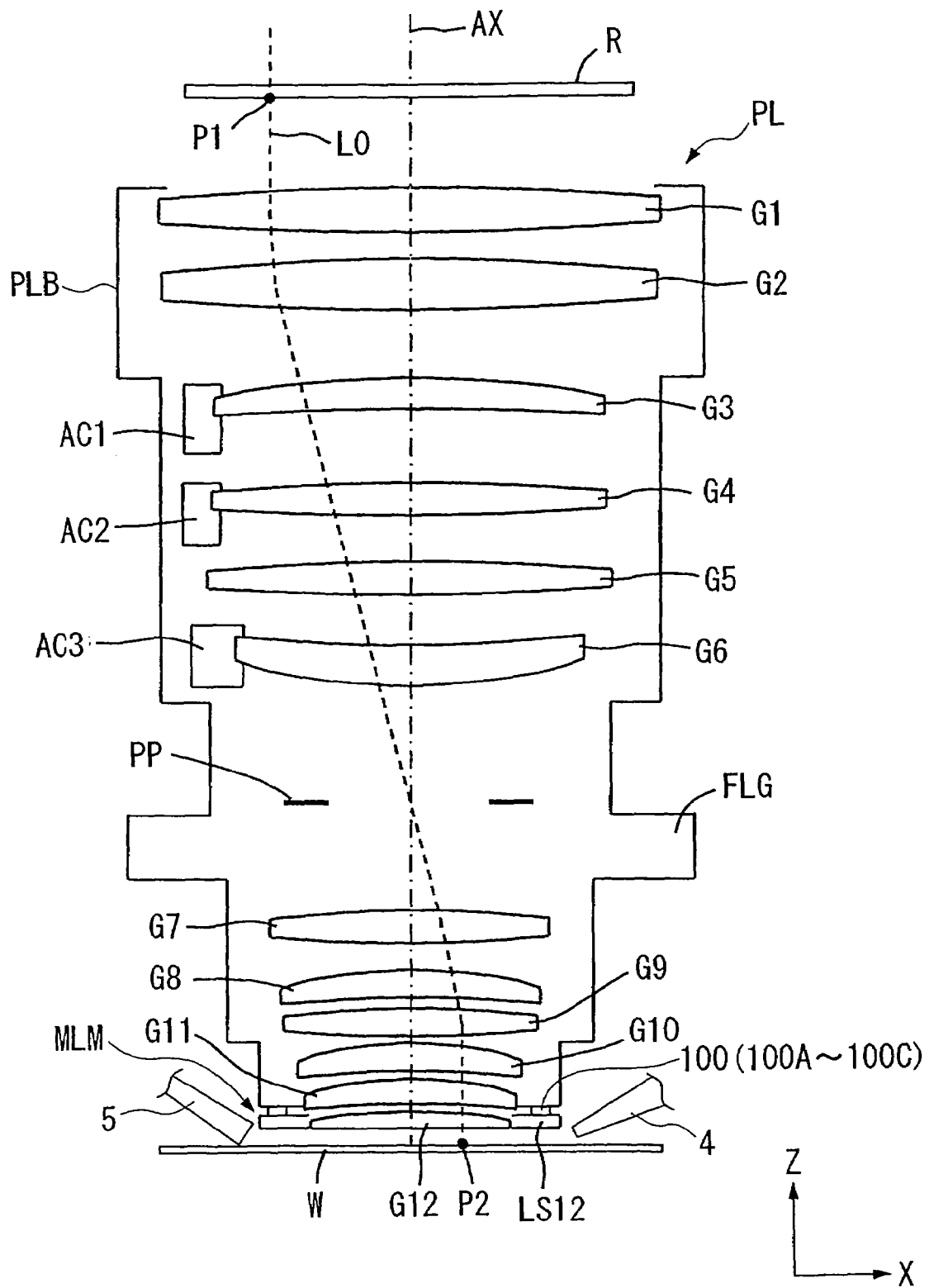
FIG. 4 is a block diagram that shows an embodiment of the projection optical system relating to the present invention.

FIG. 4 is a schematic block diagram that shows the projection optical system PL. The reticle R is arranged on the object plane side of the telecentric projection optical system PL formed by a plurality of lens elements (optical elements) G1 to G12. The lens elements G1 to G12 are arranged at the prescribed locations within the barrel PLB along the optical axis AX, but in the present embodiment, lens elements G3, G4 and G6 are supported by a ring-shaped lens cell that is capable of fine movement in directions with two degrees of freedom (X translation, Y translation), directions with three degrees of freedom (Z translation, θX inclination, θY inclination), or directions with five degrees of freedom (X translation, Y translation, Z translation, θX inclination, θY inclination) with respect to the barrel PLB by means of actuators AC1, AC2, AC3 such as the respective piezo expansion and contraction elements and voice coil motors (VCM).

There three lens elements capable of fine movement, G3, G4, and G6, are for correcting the various aberrations of the projection optical system PL, and it is possible to perform fine adjustment of the image quality (magnification error, distortion aberration, comatic aberration, astigmatic aberration, image plane distortion, etc.) and image plane position when the circuit pattern of the reticle R undergoes image formation and projection onto the substrate W arranged on the image plane side of the projection optical system PL. Note that the mechanism that performs image adjustment by moving the lens element in the projection optical system PL is disclosed in, for example, Japanese Laid-Open Publication No. H11-195602. In FIG. 4, among the light beams from any point P1 in the reticle R, the principal light beam LO, which intersects with the optical axis AX at the center of the pupil plane PP of the projection optical system PL and that reaches the corresponding point P2 on the substrate W, comes to be parallel with the optical axis AX between the reticle R and lens element G1 and between lens element G11 and the substrate W, and the ratio of the distance of point P1 from the optical axis AX to the distance of point P2 from the optical axis AX is the overall projection magnification β of this projection optical system PL.

The lens element (hereunder, called "front lens element" as appropriate) G12 positioned at the front end of the image side of the projection optical system PL is supported by a lens holding portion MLM that is vibrationally separated from the barrel PLB in which the other lens elements G1 to G11 are supported. The lens holding portion MLM, as discussed above comprises a lens cell LS12, that holds the front lens element G12 and a connection mechanism 100 that softly connects the lens cell LS12 to the barrel PLB, and through the connection mechanism 100, the barrel PLB and the lens cell LS12 are vibrationally seperated, and the vibration of the lens cell LS12 is absorbed so that it is not transmitted to the barrel PLB.

In the case of the liquid immersion scanning of the present invention, liquid LQ is supplied from liquid supply nozzle 4 so that the gap of 1 to 2 mm between the lower surface of lens element G12 and the substrate W is filled as the liquid LQ is recovered from liquid recovery nozzle 5, so there is concern that the liquid LQ of the liquid immersion region AR2 will come to have positive pressure to a certain extent, and the rigidity of the liquid LQ will rise. In addition, in the resent embodiment, the exposure apparatus EX is a scanning exposure apparatus, and the substrate W in such a case moves at a maximum velocity of approximately 500 mm/sec in the X axis direction, and an autofocus operation and autolevelling operation (AF/AL operation) are performed so that the surface (exposure plane) of the substrate W is maintained within the depth of focus of the projection optical system PL even daring scanning exposure. The substrate W AL/AF operation is normally performed by moving and inclining the substrate stage WST (substrate holder) that normally holds the substrate W slightly in the optical axis direction (Z axis direction), so when the front lens element G12 of the projection optical system PL is securely fixed to the entire barrel PLB, the vibration component generated on the substrate W side is transmitted to the entire barrel PLB via the liquid LQ of the liquid immersion region AR2 due to the AF/AL operation that attempts to fixedly hold gap distance (gap) between the lower surface of lens element G12 and the substrate W surface. In addition, there are cases in which vibration occurs due to slight fluctuations of the air bearing gap that are likely to occur during stage acceleration in which there is no sliding vibration in the case of a non-contact guide system in which the substrate stage WST that supports the substrate W and moves in the X axis and Y axis directions uses air bearings, for example. The overall projection optical system PL is supported by placing its own weight on the column CL via a flange portion FLG provided in the vicinity of the center of the barrel PLB, so the vibration that has been transmitted to the barrel PLB is also transmitted to the respective lens elements inside the barrel PLB and the column CL, and the quality of the projected image deteriorates due to the effects of that vibration. In addition, there is a possibility that image blur will occur due to that vibration, and the pattern will not be formed at the prescribed position on the substrate W.

Conventionally, the working distance of the projection optical system PL was spatially separated, so there was no direct transmission of such a vibration component produced on the substrate W side to the projection optical system PL side, but in the case of liquid immersion exposure, it is preferable that the thickness of the liquid immersion region AR2 (the thickness in the optical axis direction) be set to 1 to 2 mm and, if possible, 1 mm or less, and with a liquid immersion region AR2 with this degree of thickness, the front lens element G12 of the projection optical system PL and the substrate W are considered to be directly mechanically linked by a rigid body having a uniform coefficient of elasticity and spring constant, so the vibration component produced on the substrate W side is directly transmitted to the projection optical system PL side (the optical group MPL side). Therefore, in the present embodiment, as shown in FIG. 4, at least the front lens element G12 that comes into contact with the liquid LQ of the liquid immersion region AR2 is supported by a lens cell LS12 that is separate from the barrel PLB, and the barrel PLB and the lens cell LS12 are connected by a connection mechanism 100, and lens element G12 (lens cell LS12) has micron order degrees of freedom, and, theoretically, three degrees of freedom, which are Z translation fine movement, θX tilt fine movement and θY tilt fine movement. Specifically, at least the lens cell LS12 that holds the front lens element G12 is softly connected to the barrel PLB of the optical group MPL in at least the Z axis direction via the connection mechanism 100 and movably connected to the barrel PLB in the Z axis direction, the θX direction and the θY direction, so the vibration produced on the substrate W side is absorbed by that softness, and, through this, the vibration that acts on the barrel PLB is shielded or reduced.

Figure 5:
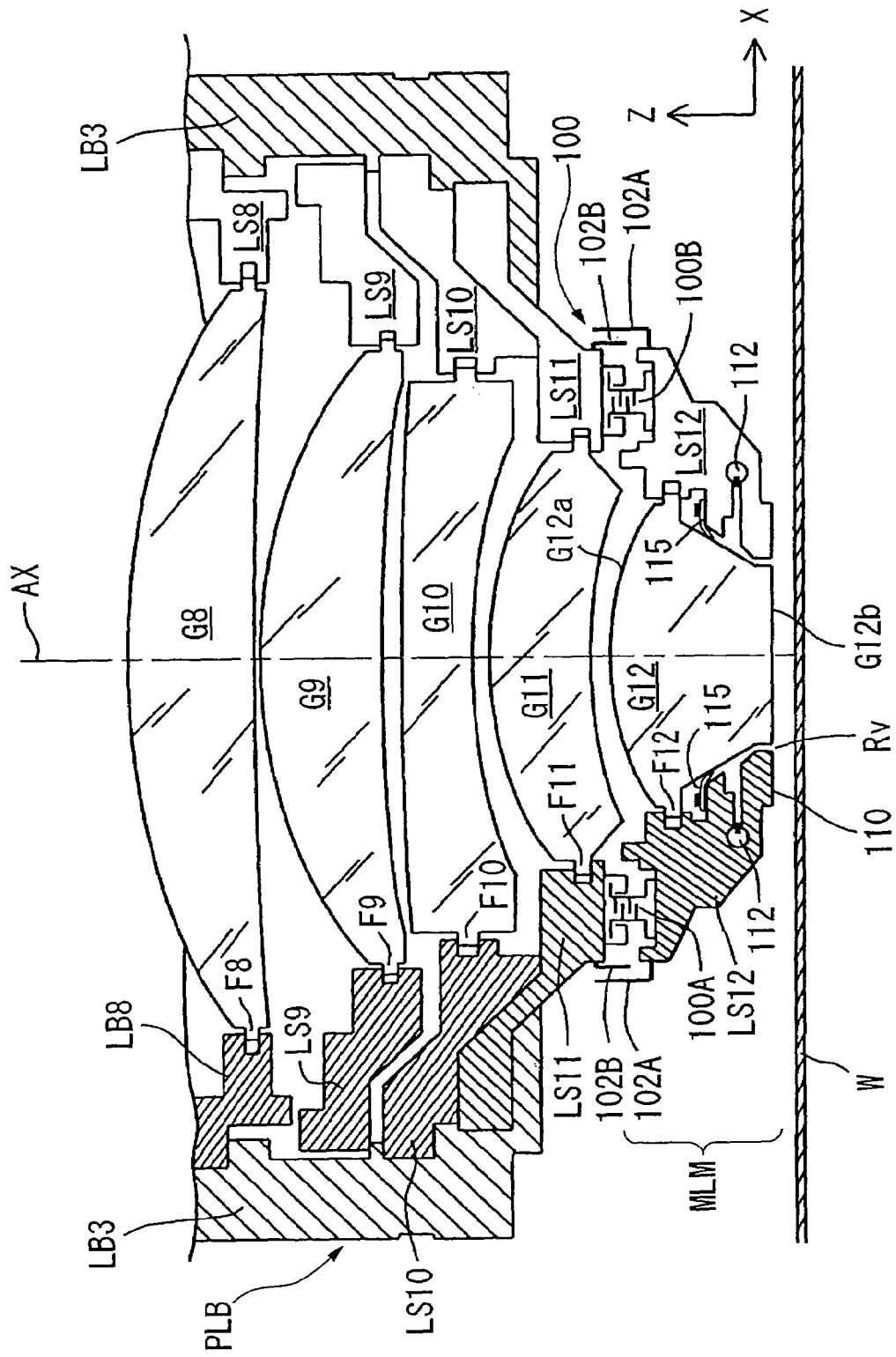
FIG. 5 is an enlarged cross-sectional view of the vicinity of the first holding member and the connection mechanism.

FIG. 5 is an enlarged cross-sectional view of the vicinity of the front lens element G12 of the projection optical system PL and the lens holding portion MLM. Ring-shaped lens cells LS8, LS9, LS10, LS11 that kinematically support the flanges F8, F9, F10, F11 formed on the respective end faces of the lens elements G8, G9, G10, G11 are secured within the outer barrel LB3 that is lowest end portion of the barrel PLB. In addition, the lowest side portion of lens cell LS11 is provided so that it protrudes further downward than the outer barrel LB3, and the lens holding portion MLM that supports lens element G12 is attached to the lowest surface portion of lens cell LS11 secured to that barrel PLB (outer barrel LB3). The lens holding portion MLM comprises a lens cell LS12 that kinematically supports flange F12 formed on the end face portion of lens element G12 and three flexures 100A, 100B, 100C that form a connection mechanism for softly connecting lens cell LS12 to lens cell LS11 of the outer barrel LB3 side. Note that, in FIG. 5, only two flexures 100A, 100B are illustrated to facilitate understanding, but they are actually arranged at three locations at 120 degree intervals on a circle centering on the optical axis AX. The respective flexures 100B, 100B, 100C are elastic members that have the characteristic of elastically elongating and contracting in the optical axis direction (Z axis direction) and the characteristic of lens cell LS12 being able to elastically deform relative to lens cell LS11 by several μm in the horizontal direction as well (a circular irradiation direction centering on the optical axis AX).

For the front lens element G12 of the projection optical system PL, it is preferable that the radius of curvature of the upper surface G12a thereof be a relatively small convex surface (spherical surface or aspherical surface) and that the lower surface G12b thereof be a flat surface (the radius of curvature is nearly infinitely large). In addition, in the present embodiment, the lowest surface portion 110 of lens cell LS12 is a ring-shaped flat plane of a height that nearly matches that of the lower surface G12b of lens element G12, and through this the flow of the liquid LQ of the liquid immersion region AR2 becomes smooth.

In addition, the design is such that a slight gap RV of approximately 1 mm is formed between the edge portion of the lower surface G12b of the lens element G12 and the lowest surface portion 110 of the lens cell LS12, but a ring-shaped gas supply tube 112 that communicates with the gap RV and a ring-shaped elastic seal member 115 are provided inside the lens cell LS12 so that the liquid LQ of the liquid immersion region AR2 does not rise up from that gap RV causing splashing or steaming of the liquid LQ to adhere to the lens element G11 that is on top. The gas supply tube 112 is connected to a pressurization pump via a tube, etc., and it supplies positive pressure nitrogen gas, etc. to the RV gap to prevent liquid LQ or splashes from getting in from the gap RV. The natural flow of the liquid LQ from the liquid immersion region AR2 is created by the liquid supply nozzle 4 and the liquid recovery nozzle 5, so the supply of positive pressure gas by the gas supply tube 112 is set to a pressure that would not markedly hinder that flow, and, even so, the liquid, splashes and steam that penetrate from the gap RV are blocked by the elastic seal member 115 that is on top. This elastic seal member 115 is pressure welded to the entire circumference of the side surface of lens element G12, and it also has an airtightness function that interposes a space with respect to the lens element G11 that is on top, and through this it is possible to use nitrogen gas to fill the inside of the barrel space where up to lens elements G1 to G11 are positioned and up to the upper surface G12a of the front lens element G12. The elastic seal member 115 may be similarly configured with a first seal member 330 of the second embodiment to be discussed later.

Note that, in FIG. 5, an upward facing cylindrical fin 102A secured to the outer circumference portion of lens cell LS12 and a downward facing cylindrical fin 102B secured to the outer circumference portion of lens cell LS11 are for preventing splashing of the liquid LQ from getting into the release space portion of the flexures 100A, 100B, 100C from the outside, so the fins are arranged so as to maintain the prescribed clearance even if the lens holding portion MLM tilts.

In any case, as shown in FIG. 5, in the case where an attempt is made to absorb or reduce the vibration that is transmitted from the substrate W side via the liquid immersion region AR2 while supporting lens cell LS12 by means of the tree flexures 100A, 100B, 100C, it is necessary for the response frequency during fine movement of the lens holding portion MLM to be equally high, and for that reason when a structure that supports the weight of the entire lens cell LS12 with only the three flexures 100A, 100B, 100C is used, the required response frequency cannot be obtained, so it is preferable that a load cancellation mechanism (load reduction mechanism) be brought in to reduce the action of the load of the lens cell LS12 on the flexures 100A, 100B, 100C.

Figure 6:
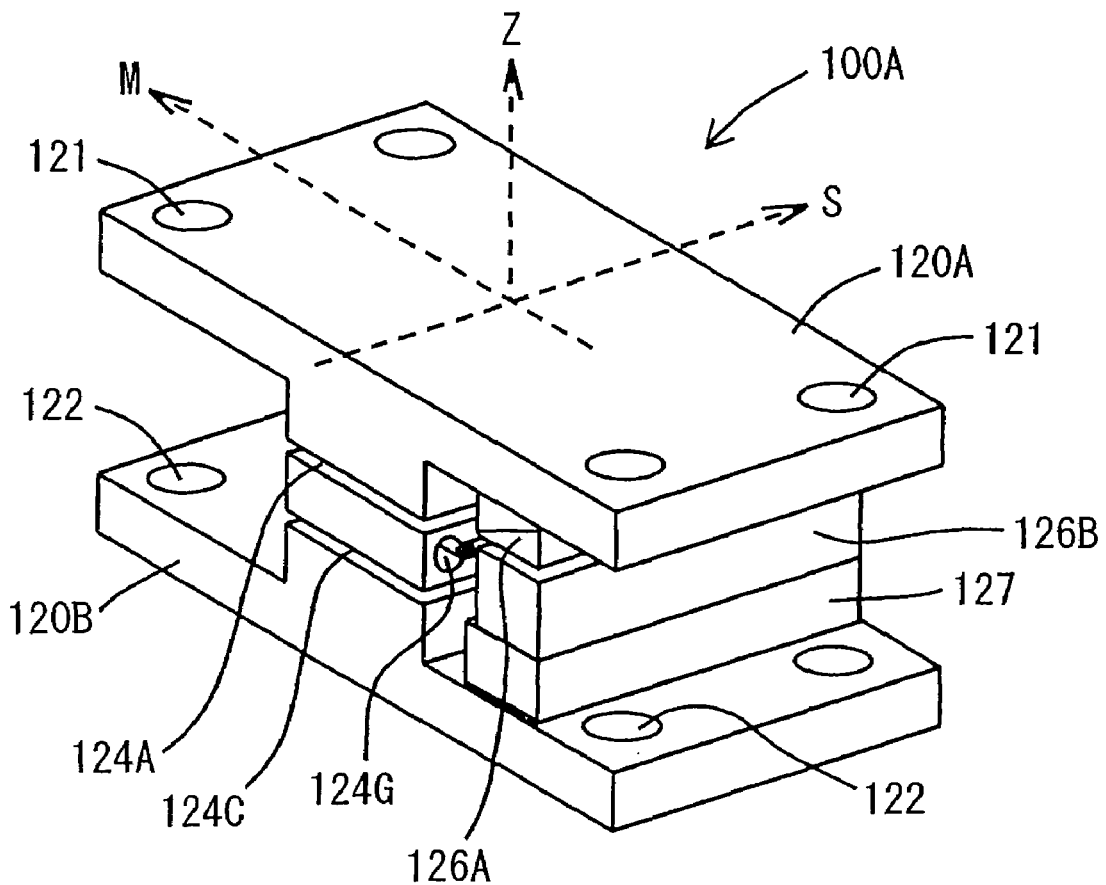
FIG. 6 is an oblique view of the flexure that comprises the connection mechanism.
Figure 7:
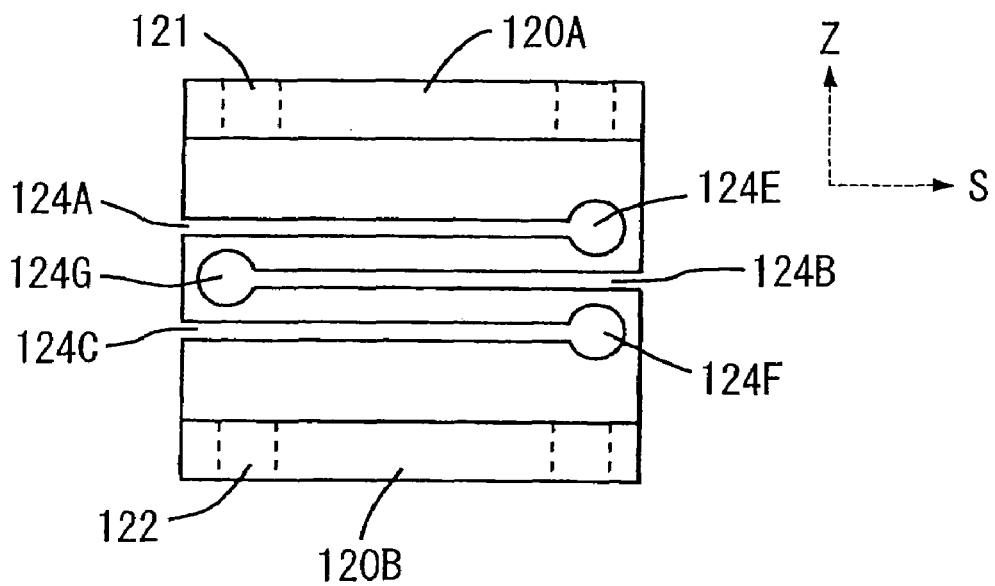
FIG. 7 is a front view of the flexure that comprises the connection mechanism.

FIG. 6 is a drawing that shows the structure of flexure 100A with a load cancellation mechanism. Note that flexures 100B and 100C also have a configuration this is equivalent to that of flexure 100A. In FIG. 6, the Z axis of coordinate system MSZ is parallel to the optical axis AX, the S axis is in an irradiation direction that is perpendicular to the optical axis AX and the M axis is in a tangential direction that is perpendicular to both the S axis and the Z axis. In addition FIG. 7 shows flexure 100A of FIG. 6 from the M axis direction. Flexure 100A forms a metal material such as SUS or duralumin as an H-shaped block, and it has a flexure portion that forms a plurality of notches 124A, 124B, 124C that pierce trough in the M axis direction and cylindrical through holes 124E, 124F, 124G at the center portion that connects the upper plate portion 120A and the bottom plate portion 120B. In addition, the upper plate portion 120A is secured to the lower surface portion of lens cell LS11 in FIG. 5 via four machine screw holes 121, and bottom plate portion 120B is sucured to the upper surface portion of lens cell LS12 via four machine screw holes 122.

This structure is able to make the rigidity in the Z axis direction and the S axis direction a great deal lower as it makes the rigidity in the M axis direction a great deal higher even though the upper plate portion 120A and the bottom plate portion 120B are mechanically connected. As a result, elastic elongation and contraction in the Z axis direction relative to the upper plate portion 120A and the bottom plate portion 120B becomes possible, and a relatively small amount of deformation is possible with respect to the S direction as well. By providing three of this type of flexure structure at 120 degree intervals, a structure is formed in which lens cell LS12 is suspended on lens cell LS11 (barrel PLB) in status in which the rigidity in the XY direction is high overall, the degree of freedom of movement of the lens cell LS12 is limited by parallel movement in the Z axis direction, and lens cell LS12 is kinematically supported with respect to the barrel PLB.

In addition, the load cancellation mechanism is formed by a permanent magnet 126A secured to the lower surface of the upper portion plate 120 and a permanent magnet 126B secured to the upper surface of the bottom plate portion 120B via a height adjustment mechanism portion 127, and the pair of permanent magnets 126A, 126B oppose each other leaving a prescribed gap. In addition, due to the magnetic pull of the permanent magnets 126A, 126B, nearly the greater part of the load of lens cell LS12 secured to the bottom plate portion 120B is pulled up. In this way, that upper plate portion 120A is connected to the lens cell LS11 (barrel PLB), the bottom portion plate 120B is connected to lens cell LS12, and flexures 100A to 100C that have permanent magnets 126A, 126B that form a load cancellation mechanism support the load of the lens cell LS12 on lens cell LS11.

Note that, in FIG. 6, the pair of permanent magnets 126A, 126B are shown on only one side of the flexure portion, but of course the same type of permanent magnets 126A, 126B and an adjustment mechanism portion 127 are formed on the opposite side as well. The adjustment mechanism portion 127 is for adjusting the gap interval of the pair of permanent magnets 126A, 126B so that the load of lens cell LS12 does not act on the flexure portion of the center portion of flexure 100A (similarly for 100B and 100C) insofar as this is possible, and, for example, it is formed by a simple Z translation mechanism that uses a taper cam. This adjustment mechanism portion 127 is also used in cases in which the gap interval of the pair of permanent magnets 126A, 126B is reduced during periodic maintenance of the exposure apparatus to handle a reduction in magnetism resulting from changes in the permanent magnet 126 over time.

Through this type of load cancellation, the respective flexures 100A, 100B, 100C are supported in a near neutral status in which they do not mechanically deform, and the rigidity of the respective flexure units can be reduced, so the lens holding portion MLM is suspended on the lowest end of the bar PLB with an extremely low rigidity, and the front lens element G12 must have the transmission of vibration from the substrate W side absorbed or reduced, and it is capable of fine movement following the behavior of the liquid immersion region AR2.

Note that, in FIG. 6, load cancellation is performed by the magnetic action of a pair of permanent magnets, but force may be generated without contact and it is possible to use a pair of a permanent magnet and a piece of iron or a pair of an electromagnet and a piece of iron (or a magnet). In addition, for the flexure, here, an H-shaped block material was created by processing as in FIG. 6, but it may be one made by combining a plurality of thin plate springs so that the same degree of freedom and rigidity can be obtained.

In any case, through the flexures 100A to 100C, the front lens element G12 of the projection optical system PL has come to move freely, so the accompanying quality of the projected image (magnification, distortion aberration, comatic aberration, astigmatic aberration, etc.) changes, and it is necessary to compensate for image quality deterioration by controlling the actuators AC1, AC2, AC3 that drive the respective lens elements G3, G4, G6 in FIG. 4 in real time.

Figure 8:
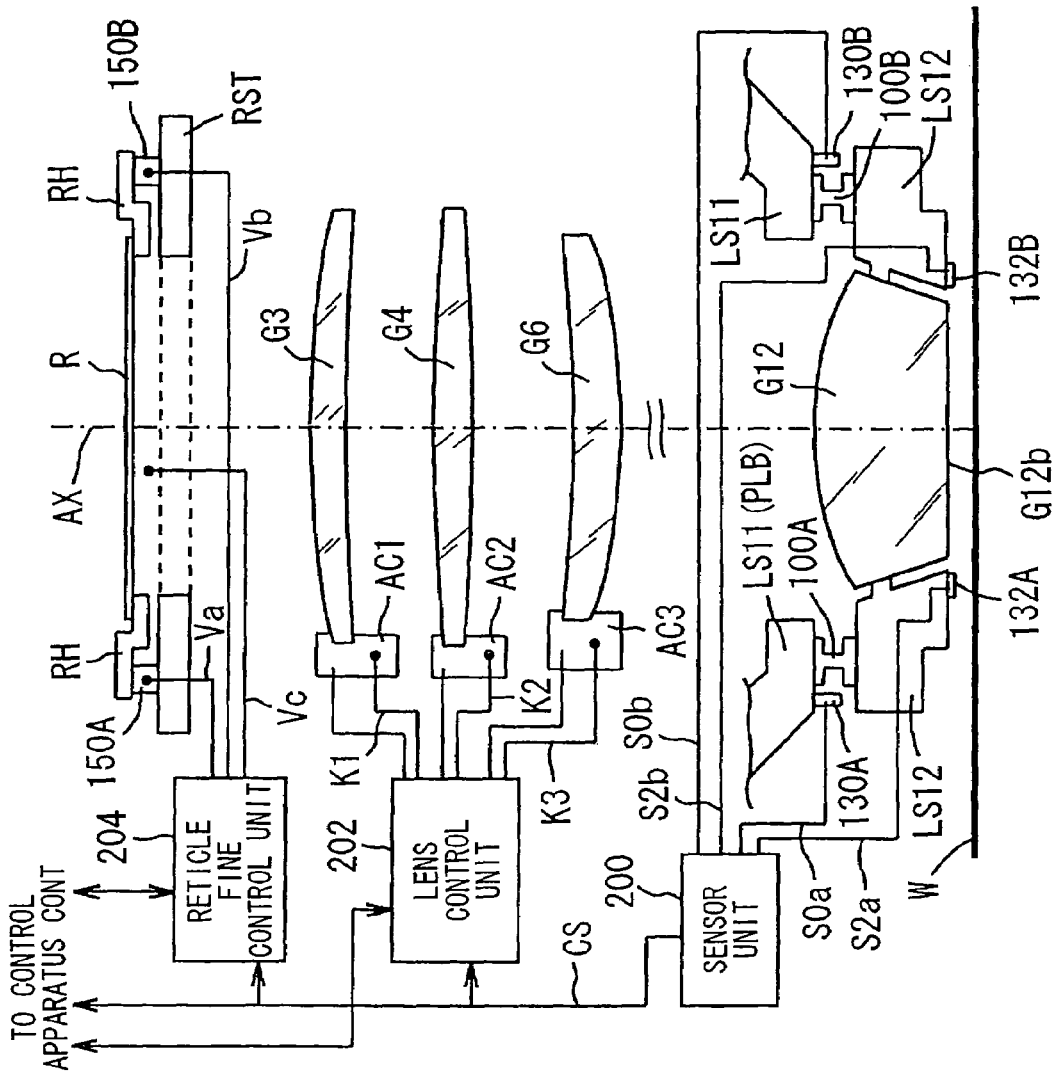
FIG. 8 is a control block diagram of the image adjust mechanism.

FIG. 8 is a schematic block diagram of the control system applied to the apparatus shown in FIG. 1 to FIG. 7. In FIG. 8, the reticle R is held on the reticle holder RH so that it is nearly perpendicular to the optical axis AX by means of vacuum suction or a mech-clamp mechanism, and the reticle holder RH is provided on the reticle stage RST, which moves at high speed in the prescribed scanning direction during scanning exposure, via three Z actuators 150A, 150B, 150C (where 150C is not shown in the drawing). The Z actuators 150A, 150B, 150C are formed by a piezo element and a voice coil motor (VCM), and they translation move the reticle holder RH in the Z axis direction overall in small amounts in response to drive signals Va, Vb, Vc from a reticle fine control unit (image adjustment mechanism) 204 and cause tilting by a slight amount in the θX direction and the θY direction. The fine movement of this reticle holder RH is controlled in real time for the various types of positional error correction and distortion correction during scanning exposure, so the reticle holder RH is created by fine ceramic materials that include a carbon graphite material structure on a portion to pursue lightness of weight and high rigidity.

In addition, the actuators AC1, AC2, AC3 that drive the three lens elements G3, G4, G6 shown in FIG. 4 can be mutually independently controlled in response to the respective drive signals K1, K2, K3 from the lens control unit (image adjustment mechanism) 202, but a holographic encoder, an electrostatic capacitance sensor, etc., which measure the drive amount, are provided inside the respective actuators AC1, AC2, AC3, and signals from these measuring instruments are input to the lens control unit 202 as feedback signals.

In the vicinity of the respective flexures 100A, 100B, 100C (where 100C is not shown in the drawing) in the lens holding portion MLM, gap sensors (first detectors) 130A, 130B, 130C (where 130C is not shown in the drawing) for measuring height changes of the upper surface of lens cell LS12 of that member are provided. The gap sensors 130A, 130D, 130C are attached to lens cell LS11 of the barrel PLB, and they are able to measure changes in the distance of lens cell LS12 with respect to lens cell LS11. The measurement signals S0$a$, S0$b$, S0$c$ from the respective sensors 130A, 130B, 130C (where S0$c$ is not shown in the drawing) are read by the sensor unit 200, and posture changes (Z position changes and θX direction and θY direction tilt changes) of lens cell LS12 based on the lens cell LS11 secured to the barrel PLB side of the projection optical system PL, that is, the positional relationship between the barrel PLB and the lens cell LS12, are detected in real time. Here, the barrel PLB holds the optical group MPL, and lens cell LS12 holds lens element G12, so the sensor unit 200 is able to detect the positional relationship between the optical group MPL and lens element G12 (the lower surface G12$b$ of lens element G12) based on the detection results of the gap sensor 130A to 130C. Specifically, detection of the positional relationship of the barrel PLB and the lens cell LS12 is essentially equivalent to detecting the positional relationship between the optical group MPL and lens element G12, and the sensor unit 200 can obtain the positional relationship be the optical group MPL and lens element G12 by using gap sensors 130A, 130B, 130C to detect the positional relationship between the barrel PLB and lens cell LS12. Note that detection of the positional relationship between the barrel PLB and lens cell G12 can be performed optically.

In addition, attached in the vicinity of lens element G12 of the lower surface of lens cell LS12 are three or more gap sensors (second detectors) 132A, 132B, 132C, . . . that measure the change in the distance to the surface (exposure surface) of the substrate W, that is, changes in the thickness of the liquid immersion region AR2, and the measurement signals S2a, S2b, . . . of these are also read by the sensor unit 200, and changes in the parallelism (direction and amount of the relative tilt) or the interval between the lower surface G12b of lens element G12 and the surface of the substrate W are detected in real time. Here, the gap sensors 132A, 132B, 132C, . . . are attached to lens cell LS12 that holds lens element G12, so the sensor unit 200 is able to detect the positional relationship between lens element G12 and the surface of the substrate W based on the detection results of the gaps sensors 132A, 132B, 132C, . . . . Specifically, detection of the positional relationship between lens cell LS12 and the surface of the substrate W is essentially equivalent to detecting the positional relationship between lens element G12 and the surface of the substrate W, and the sensor unit 200 can obtain the positional relationship between lens cell LS12 and the surface of the substrate W by using gap sensors 132A, 132B, 132C to detect the positional relationship between lens element G12 and the surface of the substrate W. Note that detection of the positional relationship between lens cell LS12 and the surface of the substrate W can also be performed optically.

The measurement information CS measured by this sensor unit 200 is sent in real time to a front lens control unit 202 and a reticle fine control unit 204. The lens control unit 202 must correct the errors of the respective aberration components that secondarily occur according to changes in the position and the posture of the front lens element G12 in real time based on that measurement information CS, specifically, an offset component is added in real time to the drive signals K1, K2, K3 going to the respective actuators AC1, AC2, AC3 and the pattern image projected onto the substrate W is adjusted so that fluctuations of lens cell LS12 with respect to the barrel PLB or fluctuations of lens cell LS12 with respect to the surface of the substrate W are compensated for. Here, fluctuations in the positional relationship of lens cell LS12 with respect to the barrel PLB are essentially equivalent to fluctuations in the positional relationship of lens element G12 relative to the optical group MPL, so the lens control unit 202 is able to compensate for fluctuations in the lens element G12 relative to the optical group MPL based on the measurement information CS of the sensor unit 200. Similarly, fluctuations in the positional relationship of lens cell LS12 relative to the surface of the substrate W are essentially equivalent to fluctuations in the positional relationship of lens element G12 with respect to the surface of the substrate W, so the lens control unit 202 is able to compensate for fluctuations in the lens element G12 relative to the surface of the substrate W based on the measurement iron CS of the sensor unit 200.

In the same way, the reticle fine control unit 204 must correct the errors of the respective aberration components that secondarily occur according to changes in the position and the posture of the lens element G12 and is able to add an offset component in real time to the drive signals Va, Vb, Vc going to the respective Z actuators 150A, 150B, 150C that control the Z position and tilt of the reticle holder RH (reticle R) based on the measurement information CS.

Note that, here, position and posture correction of the reticle R and position and posture correction of the front lens elements G3, G4, G6 are simultaneously performed, but it is not absolutely necessary to perform them all simultaneously, and they may be appropriately selected based on the type of movement of front lens element G12, that is, whether it is a simple change in the Z position, a change in the tilt or a combination of both.

Figure 9:
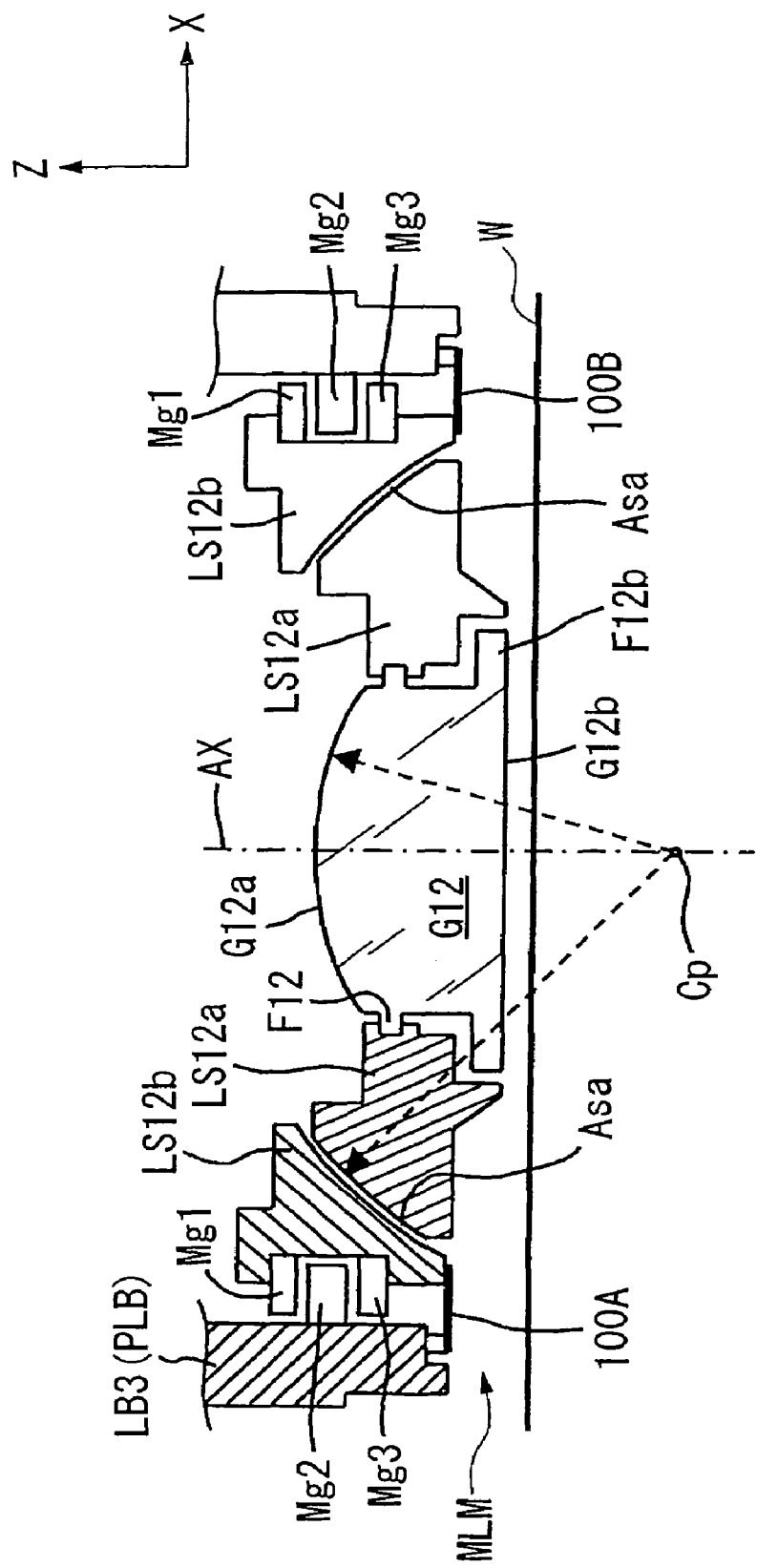
FIG. 9 is a block diagram that shows another embodiment of the projection optical system relating to the present invention.

FIG. 9 is a partial cross-sectional view that shows another embodiment of the lens holding portion MLM, and, here, the upper surface G12a of the front lens element G12 is formed in a convex spherical surface shape whose center of curvature is a point Cp on the optical axis AX, and the lower surface G12b is formed as a flat surface. In addition, a flange portion F12b that is linked with the lower surface G12b is formed on the lower end portion of the front lens element G12, and the area of the liquid immersion region AR2 formed between the surface of the substrate W and the lower surface G12b is made wider than that of the previous embodiment explained while referring to FIG. 5, and the uniformity of the flow of the liquid LQ is improved.

The flange F12 of the upper side of the lens element G12 is kinematically rigidly supported by the ring-shaped lens cell LS12. In addition, convex spherical seat Asa centering on point Cp is formed zonally at the outer circumference of lens cell LS12a, and a ring-shaped second lens cell LS12b on which a concave spherical seat with a radius of curvature that is almost the same as that of convex spherical seat Asa is formed is provided on the outside of lens cell LS12a. A vacuum pre-load or magnetic pre-load air bearing is formed between the mutually opposing convex spherical seat Asa of lens cell 12a and the concave spherical seat of second lens cell 12b.

At the outer circumference of the second cell LS12b, pairs of permanent magnets Mg1, Mg3 arranged while opening a prescribed gap vertically are secured at a plurality of locations on the circumference. In addition, a load cancellation mechanism is formed by magnets Mg1 and Mg3 and a permanent magnet Mg2 secured to the inner side of the outer barrel LB3 so that it is arranged in the gap of this set of magnets Mg1, Mg3. Also, plate spring-shaped flexes 100A, 100B, . . . are provided at a plurality of locations along the circumference centering on the optical axis AX between the lower surface end portion of second cell LS12b and the outer barrel LB3. These plate spring-shaped flexures 100A, 100B, . . . are made so that rigidity in the Z axis direction is extremely small, and the rigidity in the horizontal direction (XY direction) becomes larger, and the second cell LS12b and lens cell LS12a are caused to perform fine movement in the Z axis direction as a unit.

Through the aforementioned configuration, lens cell LS12a is restricted only by the pre-load air bearing of the spherical seat with respect to second cell LS12b, so it is possible to freely slightly tilt with point Cp as the center. That is, even if the front lens element G12 is tilted from the center position, it is maintained so that the interval between the convex spherical surface of the upper surface G12a thereof and the concave spherical surface of the lower surface of lens element G11 (see FIG. 5) is constant everywhere at the same diameter position on the spherical surface. However, only in the case where lens cell LS12a and second cell LS12b perform fine movement vertically as a unit, the interval between the convex spherical surface of the upper surface G12a and the concave spherical surface of the lower surface of lens element G11 changes overall. For this reason the respective aberrations that occur secondarily due to movement of the front lens element G12 can be restricted to specific types, and there is an advantage in that it is possible to also reduce the amount arrived at by the lens control unit 202 or the reticle fine control unit 204 explained while referring to FIG. 8 adding correction to the posture of the lens element G3, G4, G5 and reticle holder RH or of reducing the elements that require posture correction.

Note that, in the above embodiment, compensation is performed so that deterioration of the quality of the projected image does not occur in a self-completing manner within the projection optical system PL, or the pattern image projected onto the substrate W is adjusted by Z translation fine movement or slight tilting of the position of the reticle R in the direction of the optical axis AX, but if a light source apparatus that has a wavelength tuning mechanism such as an excimer laser or an $F_2$ laser is used for the projection exposure, by such means as slightly shifting the center wavelength of the illumination light of the reticle R, it is also possible to compensate for the deterioration of the quality of the projected image on the substrate W, and in that case real time driving of lens elements G3, G4 and G6 is not necessary at all or real time driving of just a limited number of lens elements is necessary only for assistance.

Note that, in the above embodiment, lens cell LS12 holds only one lens element G12, but it may also have a configuration that holds a plurality of optical elements (optical groups).

In addition, in the above embodiment, the projection optical system PL is divided into the two groups of optical member G12 and the optical group MPL between the reticle R and optical member G12, but it may also be divided into three groups or more. In that case, the positional relationship of optical member G12 and groups not adjacent to that optical member G12 may be detected, and compensation of positional fluctuation may be performed.

In the present embodiment, a lens element G12 is attached to the front end of the projection optical system PL, but an optical plate used in adjustment of the optical characteristics of the projection optical system PL, for example, aberration (spherical aberration, comatic aberration, etc.) may also be used as the optical element attached to the front end of the projection optical system PL. Or, it may be a parallel flat plate that is able to transmit the exposure light EL.

In the respective embodiments above, the shape of the aforementioned nozzle is not particularly limited, and, for example, supply or recovery of the liquid 30 LQ may be performed using two pairs of nozzles with respect to the long side of the projection region AR1. Note that, in this case, supply nozzles and recovery nozzles may be arranged so that they are vertically aligned to make it possible to perform supply and recovery of the liquid LQ from either the +X direction or the −X direction.

Second Embodiment

Figure 10:
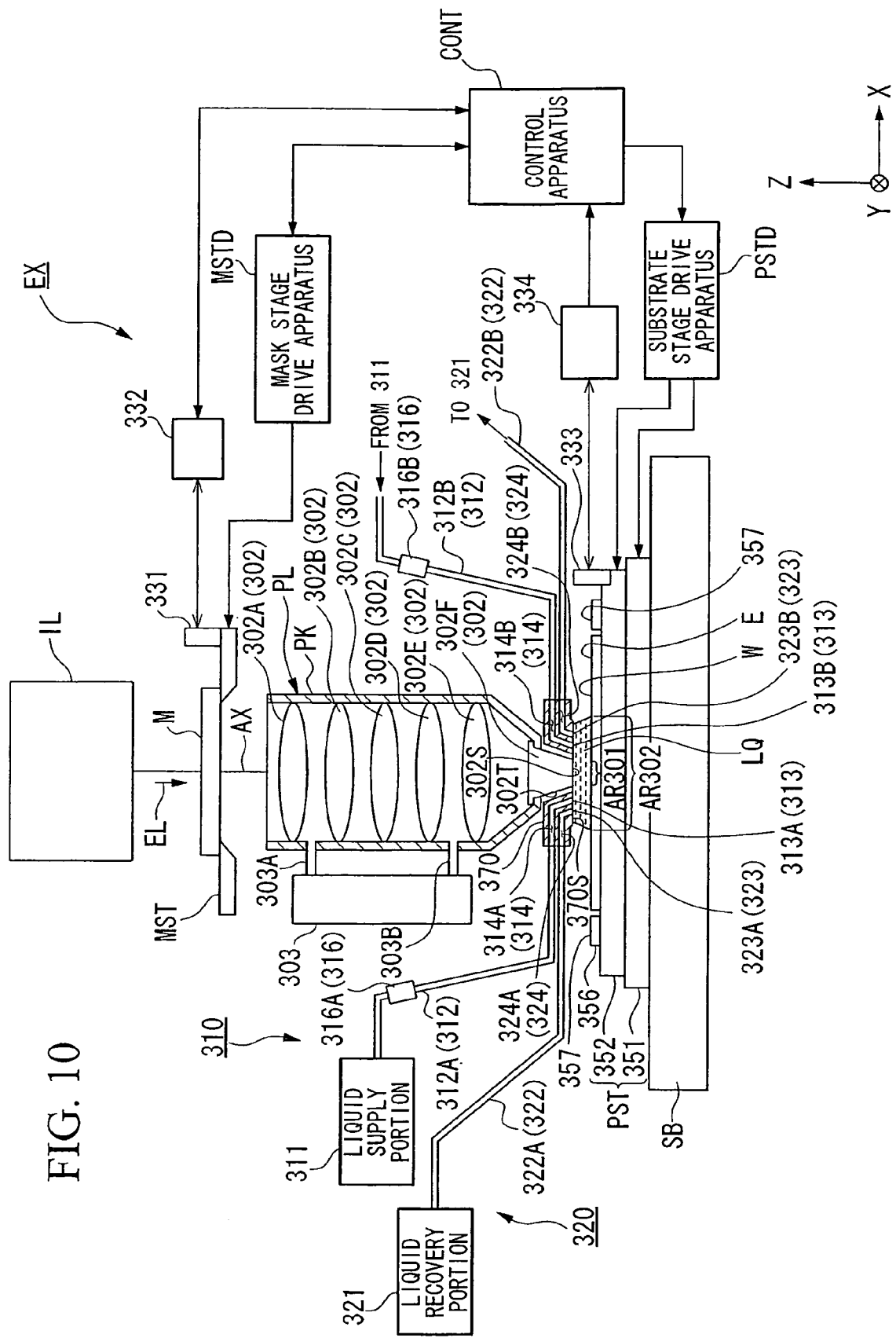
FIG. 10 is a schematic block diagram that shows an embodiment of the exposure apparatus of the present invention.

The exposure apparatus EX of the present invention will be further explained while referring to drawings. FIG. 10 is a schematic block diagram that shows an embodiment of the exposure apparatus of the present invention.

In FIG. 10, the exposure apparatus EX comprises a mask stage MST that supports a mask M, a substrate stage PST that supports a substrate W, an illumination optical system IL that uses exposure light EL to illuminate the mask M that is supported by the mask stage MST, a projection optical system PL that projection exposes the pattern image of the mask M illuminated by the exposure light EL onto the substrate W supported on the substrate stage PST, and a control apparatus CONT that comprehensively controls operation of the entire exposure apparatus EX.

The exposure apparatus of the present embodiment EX is a liquid immersion exposure apparatus that applies the liquid immersion method to effectively shorten the exposure wavelength to improve resolution as it effectively broadens the depth of focus, and it is provided with a liquid supply mechanism 310 that supplies a liquid LQ onto the substrate W and a liquid recovery mechanism 320 that recovers the liquid LQ on the substrate W. The exposure apparatus EX locally forms a liquid immersion region AR302 that is larger than projection region AR1 and smaller than the substrate W on a portion of the substrate W that contains the projection region AR301 of the projection optical system PL using a liquid LQ supplied from a liquid supply mechanism 310 at least while the pattern image of the mask M is being transferred onto the substrate W. Specifically, the exposure apparatus EX adopts a local liquid immersion system that fills in a liquid LQ between the optical element 302F of the terminating end portion of the image plane side of the projection optical system PL and the substrate W surface arranged on that image plane side and projection exposes the pattern of the mask M onto the substrate W by irradiating exposure light EL that has passed through a mask M on the substrate W via the projection optical system PL and the liquid LQ between this projection optical system PL and the substrate W.

In the present embodiment, an explanation will be given which uses as an example the case of a scanning exposure apparatus (a so-called scanning stepper) that, as the exposure apparatus EX, synchronously moves the mask M and the substrate W in mutually different directions (opposite directions) for example while exposing the pattern formed on the mask M onto the substrate W. In the following explanation, the direction that matches the optical axis AX of the projection optical system PL is the Z axis direction, the synchronous movement direction (scanning direction) of the mask M and the substrate W within a plane perpendicular to the Z axis direction is the X is direction, and the direction (non-scanning direction) perpendicular to the Z axis direction and the X axis direction is the Y axis direction. In addition, the rotation (tilting) directions around the X axis, Y axis and Z axis are the $\theta X$, $\theta Y$ and $\theta Z$ directions respectively. The illumination optical system IL uses exposure light EL to illuminate a mask M that is supported on the mask stage MST, and it has an exposure light source, an optical integrator that evens out the illumination intensity of the luminous flux that has exited from the exposure light source, a condenser lens that focuses the exposure light EL from the optical integrator, a relay lens system, and a variable field diaphragm that sets the illumination region on the mask M resulting from the exposure light EL in a slit shape. The prescribed illumination region on the mask M is illuminated by exposure light EL with an even illumination intensity distribution by means of the illumination optical system IL. Used as the exposure light EL irradiated from the illumination optical system IL are, for example, deep ultraviolet light (DUV light) such as ultraviolet band bright lines (g-rays, h-rays, i-rays) irradiated from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser light is used. In the present embodiment, demineralized water is used as the liquid LQ. Demineralized water can be passed through not only by ArF excimer laser light but deep ultraviolet light (DUV light) such as ultraviolet band bright lines (g-rays, h-rays, i-rays) irradiated from a mercury lamp and KrF excimer laser light (wavelength of 248 nm).

The mask stage MST holds a mask M, and it is capable of movement, for example, the mask M is secured by vacuum suction (or electrostatic suction). The mask stage MST is capable of two-dimensional movement within a plane perpendicular to the optical axis AX of the projection optical system PL, that is, within the XY plane, and it is capable of microrotation in the θZ axis direction by means of a mask stage drive apparatus MSTD that includes a linear motor, etc. In addition, the mask stage MST is capable of movement in the X axis direction at the specified scanning speed and has a movement stroke in the X axis direction that is sufficient for the entire surface of the mask M to at least cross the optical axis AX of the projection optical system PL. A movable mirror 331 is provided on the mask stage MST. In addition, a laser interferometer 332 is provided at a position that opposes the movable mirror 331. The θZ direction angle of rotation (depending on the case, including the angle of rotation in the θX and θY directions) and the position of the mask M on the mask stage MST in the two-dimensional direction are measured in real time by a laser interferometer 332, and the measurement results are output to a control apparatus CONT. The control apparatus CONT performs positioning of the mask M that is supported on the mask stage MST by driving the mask stage drive apparatus MSTD based on the measurement results of the laser interferometer 332.

The projection optical system PL projection exposes the pattern of the mask M onto a substrate W at a prescribed projection magnification β, and it comprises a plurality of optical elements 302 (302A to 302F) that include an optical element (optical member, lens) 302F provided at the terminating end portion on the substrate W side, and these optical elements 302A to 302F are supported by a barrel PK. In the present embodiment, the projection optical system PL is a reduction system in which the projection magnification β is ¼ or ⅕, for example. Note that the projection optical system PL may be either a magnification system or an enlargement system.

Optical element 302F of the front end portion of the projection optical system PL of the present embodiment is exposed from the barrel PK, and the liquid LQ of the liquid immersion region AR302 comes into contact with it. At least optical element 302F from among the plurality of optical elements 302A to 302F is formed of fluorite (calcium fluoride). The fluorite surface or a surface to which $MgF_2$, $Al_2O_3$, $SiO_2$, etc. has been adhered has a high affinity with water, so it is possible to cause the liquid LQ to closely adhere to nearly the entire surface of the liquid contact sure 302S of the optical element 302F. Specifically, in the present embodiment, a liquid (water) LQ that has a high affinity with the liquid contact surface 302S of the optical element 302F is supplied, so to adherence between the liquid contact surface 302S of the optical element 302F and the liquid LQ is high, and it is possible to reliably fill the optical path between the optical element 302F and the substrate W with the liquid LQ. Note that the optical element 302F may also be quartz that has a high affinity with water. In addition, hydrophilic (lyophilic) treatment may be performed on the liquid contact surface 302S of the optical element 302F to increase the affinity with the liquid LQ.

The internal space of the barrel PK of the projection optical system PL is nearly sealed, and it is maintained in the prescribed gas environment by means of a gas substitution apparatus 303. By supplying the presented gas inside the barrel PK via a pipe 303A and recovering the gas inside the barrel PK via a pipe 303B, the gas substitution apparatus 303 maintains the interior of the barrel PK to the prescribed gas environment. In the present embodiment, the interior of the barrel PK is filled with an inert gas such as helium, argon or nitrogen. If the exposure light EL is vacuum ultraviolet light, when light absorbing substances that have strong absorption characteristics with respect to light in the relevant wavelength bands, such as oxygen molecules, water molecules, carbon dioxide molecules, organic compounds, etc. are present inside the optical path space, which is the space through which the exposure light EL passes, the exposure light EL is absorbed by the light absorbing substance and cannot reach onto the substrate W at a sufficient luminous intensity. However, by fairly tightly sealing the interior of the barrel PK, which is the optical path space through which the exposure light EL passes, to block the inflow of the light absorbing substance from the exterior and by filling the interior of that barrel PK with inert gas, it is possible to cause the exposure light EL to reach the substrate W at sufficient luminous intensity.

Note that the gas substitution apparatus 303 may supply dry air instead of inert gas.

In addition, the barrel PK may be a configuration in which a plurality of divided barrels (sub-barrels) are confined. The optical element 302F that comes into contact with the liquid LQ from among the plurality of optical elements 302A to 302F that comprise the projection optical system PL may be held by a holding member (lens cell) that is separate from the barrel (barrel main unit) PK that holds the other optical element 302A to 302E. In this case, the barrel main unit PK and the lens cell may be such that the flexures 100A to 100C explained in the first embodiment perform linking using the prescribed linking mechanism.

The substrate stage PST supports a substrate W and is movable, and it is formed including an XY stage 351 and a Z tilt stage 352 built onto the XY stage 351. The XY stage 351 is supported without contact via a gas bearing (air bearing), which is a non-contact bearing that is not shown in the drawing above the upper surface of the stage base SB. The XY stage 351 (substrate stage PST) is capable of two-dimensional movement within a plane perpendicular to the optical axis AX of the projection optical system PL, that is, within the XY plane, and is capable of microrotation in the θZ direction by means of a substrate stage drive apparatus PSTD including a linear motor, etc. in a status which it is supported without contact with respect to the upper surface of the stage base SB. A Z tilt stage 352 is built onto this XY stage, and the substrate W is held by vacuum suction, for example, on the Z tilt stage 352 via a substrate holder that is not shown in the drawing. The Z tilt stage 352 is movably provided in the Z axis direction, the θX direction and the θY direction. The substrate stage drive apparatus PSTD is controlled by a control apparatus CONT.

A movable mirror 333 is provided on the substrate stage PST (Z tilt stage 352). A laser interferometer 334 is provided at a position that opposes the movable mirror 333. The position and the angle of rotation of the substrate W on the substrate stage PST in the two-dimensional direction are measured in real time by the laser interferometer 334, and the measurement results are output to a control apparatus CONT. The control apparatus CONT performs positioning of the substrate W supported on the substrate stage PST by driving the substrate stage drive apparatus PSTD, including a linear motor, etc., based on the measurement results of the laser interferometer 334.

In addition, the exposure apparatus EX is equipped with a focus leveling detection system, which is not shown in the drawing, that detects the position of the surface of the substrate W supported by the subs stage PST. Note that, for the configuration of the focus leveling detection system 80, it is possible to use the one disclosed in Japanese Laid-Open Publication No. H8-37149. The detection results of the focus leveling detection system are output to the control apparatus CONT. The control apparatus CONT is able to detect the position information of the sure of the substrate W in the Z axis direction and tilt information of the substrate W in the θX and θY direction based on the detection results of the focus leveling detection system. The Z tilt stage 352 controls the focus position and the tilt angle of the substrate W to match the surface of the substrate W with the image plane of the projection optical system PL using an autofocus system and an autoleveling system, and the XY stage 351 positions the substrate W in the X axis direction and the Y axis direction. Note that it goes without saying that the Z tilt stage and the XY stage are provided as a unit.

In addition, a plate member 356 that surrounds the substrate W held by the substrate stage PST is provided on the substrate stage PST (Z tilt stage 352). The plate member 356 is a ring-shaped member, and it is arranged on the outside of the substrate W. The plate member 356 has a flat surface (flat portion) 357 of nearly the same height (flush) as the surface of the substrate W held on the substrate stage PST. The flat surface 357 is arranged in the vicinity of the outside of the substrate W held on the substrate stage PST.

The plate member 356 is formed by a material that has liquid repellent properties such as polytetrafluoroethylene (Teflon (registered trademark)). For this reason, the flat surface 357 has liquid repellent properties. Note that the plate member 356 is formed by a prescribed metal, for example, and the flat surface 357 may be made liquid repellent by performing liquid repellence treatment on at least the flat surface 357 [sic] of that metal plate member 356. For the liquid repellence treatment of the plate member 356 (flat surface 357), for example, a liquid repellent material such as a fluoride group resin material such as polytetrafluoroethylene, an acrylic group resin material, or a silicon group resin material is coated, or a thin film consisting of said liquid repellent material is applied. In addition, the film for surface treatment may also be a single layer film or a film consisting of a plurality of layers. A material that is insoluble with respect to the liquid LQ is used as the water repellent material for making it liquid repellent. In addition, for the coating region of the liquid repellent material, coating may be performed on all regions of the surface of the plate member 356, and coating may be performed on only a region of one portion that requires liquid repellence, for example, the flat surface 357.

A flat member 356 that has a flat surface 357 that is nearly flush with the surface of the substrate W is provided in the vicinity of the substrate W, so even at times when liquid immersion exposure of the edge region E of the substrate W is performed, there are almost no bump portions on the outside of the edge portion of the substrate W, so it is possible to hold the liquid LQ below the projection optical system PL, and it is possible to form the liquid immersion region AR302 well on the image plane side of the projection optical system PL. In addition, by making the flat surface 357 liquid repellent, it is possible to restrict the outflow of liquid LQ to the outside of the substrate W (the outside of the flat surface 357) during liquid immersion exposure, and, after liquid immersion exposure as well, it is possible to smoothly recover the liquid LQ and prevent the liquid LQ from on the flat surface 357.

The liquid supply mechanism 310 is for supplying the prescribed liquid LQ onto the image plane side of the projection optical system PL, and it comprises a liquid supply portion 311 that is able to send out the liquid LQ and liquid supply tubes 312 (312A, 312B), one end portion of which connects to the liquid supply portion 311. Liquid supply portion 311 comprises a tank that accommodates the liquid LQ, an acceleration pump, etc. When the liquid immersion region AR302 is formed on the substrate W, the liquid supply mechanism 310 supplies liquid LQ onto the substrate W.

The liquid recovery mechanism 320 is for recovering the liquid LQ on the image plane side of the projection optical system PL, and it comprises a liquid recovery portion 321 that is able to recover the liquid LQ and recovery tubes 322 (322A, 322B), one end portion of which connects to the liquid recovery portion 321. The liquid recovery portion 321 comprises a vacuum system (suction apparatus) such as a vacuum pump, a gas-liquid separator that separates the recovered liquid LQ and gas, and a tank that accommodates the recovered liquid LQ. Note that, for the vacuum system, a vacuum system of a plant where an exposure apparatus EX is installed may be used without providing a vacuum pump on the exposure apparatus EX. In order to form a liquid immersion region AR302 on the substrate W, the liquid recovery mechanism 320 recovers a prescribed amount of the liquid LQ on the substrate W supplied from the liquid supply mechanism 320.

A channel formation member 370 is arranged in the vicinity of the optical element 302F that comes into contact with the liquid LQ from among the plurality of optical elements 302A to 302F comprising the projection optical system PL. The formation member 370 is a ring-shaped member provided so as to surround the side surface 302T of optical element 302F above the substrate W (substrate stage PST). The channel formation member 370 can be formed using aluminum, titanium, stainless steel, duralumin, or an alloy that contains these. Or, the channel formation member 370 can be formed using a transparent member (optical member) that has light permeability, such as glass (quartz).

The channel formation member 370 is provided above the substrate W (substrate stage PST), and it is provided with liquid supply ports 313 (313A, 313B) arranged to oppose the surface of that substrate W. In the present embodiment, the channel formation member 370 has two liquid supply ports 313A, 313B. Liquid supply ports 313A and 313B are provided on the lower surface 370S of the channel formation member 370. In addition, the channel formation member 370 has, in the interior thereof, supply channels (314A, 314B) that correspond to the liquid supply ports 313 (313A, 313B). One end portion of each of the supply channel 314A, 314B is connected to the supply portion 311 via the supply tube 312A, 312B, and the other end portions are respectively connected to liquid supply ports 313A and 313B.

Flow volume control instruments 316A, 316B called mass flow controllers, which control the liquid supply volume per unit time sent from the liquid supply portion 311 to liquid supply ports 313A and 313B respectively, are respectively provided in the paths of supply tubes 312A and 312B. The control of the liquid supply volume by the flow volume control instruments 316 (316A, 316B) is performed under the control of the command signals of the control apparatus CONT.

In addition, the channel formation member 370 comprises a liquid recovery port 323 provided above the substrate W (substrate stage PST) and arranged to oppose the surface of the substrate W. In the present embodiment, the channel formation member 370 has two liquid recovery ports 323A, 323B. The liquid recovery ports 323A, 323B are provided on the lower surface 370S of the channel formation member 370.

In addition, the channel formation member 370 has recovery channels 324 (324A, 324B) that correspond to the liquid recovery ports 323 (323A, 323B) in the interior thereof. One end portion of each of the recovery channels 324A, 324B is respectively connected to the liquid recovery portion 321, and the other end portions are respectively connected to liquid recovery ports 323A and 323B via the recovery tubes 322A, 322B.

In the present embodiment, the channel formation member 370 comprises the respective portions of the liquid supply mechanism 310 and the liquid recovery mechanism 320. Liquid supply ports 313A and 313B that comprise the liquid supply mechanism 310 are provided as the respective positions of both sides of the X axis direction interposing the projection region AR301 of the projection optical system PL, and the liquid recovery ports 323A, 323B that comprise the liquid recovery mechanism 320 are provided outside the liquid supply ports 313A and 313B of the liquid supply mechanism 310 with respect to the projection region AR301 of the projection optical system PL.

Operation of the liquid supply portion 311 and the flow volume control instruments 316 is controlled by the control apparatus CONT. When a liquid LQ is supplied onto the substrate W, the control apparatus CONT sends out liquid from the liquid supply portion 311 and supplies the liquid LQ onto the substrate W from liquid supply ports 313A and 313B provided above the substrate W via supply tubes 312A, 312B and supply channels 314A, 314B. At this time, the liquid supply ports 313A, 313B are respectively arranged on both sides interposing the projection region AR301 of the projection optical system PL, and liquid LQ from both sides of the projection region AR301 can be supplied via those liquid supply ports 313A, 313B. In addition, the amount per unit time of liquid LQ supplied onto the substrate W from the liquid supply ports 313A, 313B can be independently controlled by means of the respectively provided flow volume control instruments 316A, 316B of the supply tubes 312A, 31213.

The liquid recovery operations of the liquid recovery portion 321 is controlled by a control apparatus CONT. The control apparatus CONT is capable of controlling the liquid recovery volume per unit time by the liquid recovery portion 321. The liquid LQ on the substrate W recovered from the liquid recovery ports 323A, 323B provided above the substrate W is recovered by the liquid recovery portion 321 via recovery channels 324A, 324B and recovery tubes 322A, 322B of the channel formation member 370.

Note that, in the present embodiment, the supply tubes 312A, 312B are connected to one liquid supply portion 311, but liquid supply portions 311 corresponding to the number of supply tubes are plurally (here, two) provided, and supply tubes 312A and 312B are respectively connected to said plurality of the liquid supply portions 311. In addition, recovery tubes 322A and 322B are connected to one liquid recovery portion 321, but a plurality (here, two) of liquid recovery portions 321 corresponding to the member of recovery tubes are provided, and the recovery tubes 322A, 322B may be connected to said plurality of liquid recovery portions 321 respectively.

The liquid contact surface 302S of optical clement 302F of the projection optical system PL and the lower surface (liquid contact surface) 370S of the channel formation member 70 have lyophilic properties (hydrophilic properties). In the present embodiment, lyophilic treatment is performed on the liquid contact surfaces of optical element 302F and the channel formation member 370, and through that lyophilic treatment, the liquid contact surface of optical element 302F and the channel formation member 370 become lyophilic. In other words, at least the liquid contact surface among the surfaces of the member that opposes the surface to be exposed (front surface) of the substrate W held by the substrate stage PST is lyophilic. The liquid LQ of the present embodiment is water with a high polarity, so as the lyophilic treatment (hydrophilic treatment), hydrophilic properties are provided to the liquid contact surfaces of optical element 302F and the channel formation member 370 by forming a thin film using a substance with a molecular structure with high polarity such as alcohol, for example. Specifically, if water is used as the liquid LQ, treatment in which those that have molecular structures with a high polarity, such as an OH group, are provided on said liquid contact surface is preferred. Or, lyophilic materials such as $MgF_2$, $Al_2O_3$ and $SiO_2$ may be provided on said liquid contact surface.

Note that the lower surface (surface facing the substrate W side) 370S of the channel formation member 370 may be a nearly flat surface, but a surface that is tilted with respect to the XY plane and, particularly, a tilted surface (trap surface) 70 of a prescribed length that is tilted so that it is seated (so that it faces upward) with respect to the surface of the substrate W as it faces the outside with respect to the projection immersion region AR301 (liquid immersion region AR302) may be provided in a region further outside than the liquid recovery ports 323 (323A, 323B) with respect to the projection optical system PL of the lower surface 370S of the channel formation member 370. By doing so, in conjunction with the movement of the substrate W, even if an attempt is made to cause the liquid LQ between the projection optical system PL and the substrate W to flow outside the lower surface 370S of the channel formation member 370, it is captured by the trap surface, so outflow of the liquid LQ can be prevented. Here, lyophilic treatment is performed on the trap surface to make it lyophilic, and the film (such as a photosensitive material such as a photoresist, reflection prevention film or a film that protects the photosensitive material from the liquid) normally has lyophilic properties (hydrophilic properties), so the liquid LQ that has flowed to the outside of the liquid recovery port 323 is captured by the trap surface.

In addition, though not shown in the drawing, a reference member is arranged at a prescribed position outside the plate member 356 around the substrate W above the substrate stage PST (Z tilt stage 352). In the reference member, a reference mark detected by means of a substrate alignment system that has a configuration such as that disclosed in, for example, Japanese Laid-Open Publication No. H4-65603 and a reference mark detected by means of a mask alignment system that has a configuration such as that disclosed in, for example, Japanese Laid-Open Publication No. H7-176468 are provided with the prescribed positional relationship. The upper surface of the reference member is nearly flat, and the surface of the substrate W and the surface (flat surface) 357 of the plate member 356 are provided at nearly the same height (flush). The substrate alignment system is provided in the vicinity of the substrate stage PST, and it also detects alignment marks on the substrate W. In addition, the mask alignment system is provided in the vicinity of the mask stage MST, and it detects the reference mark on the substrate stage PST (Z tilt stage 352) via a mask M and a projection optical system PL.

In addition, an illumination nonuniformity sensor such as that disclosed in Japanese Laid-Open Publication No. S57-117238, for example, is arranged as the optical sensor at a prescribed position outside the plate member 356 on the Z tilt stage 352 (substrate stage PST). The illumination nonuniformity sensor comprises an upper plate that is rectangular in a planar view. The upper surface of the upper plate is a nearly flat surface, and the surface of the substrate W and the surface (flat surface) 357 of the plate member 356 are provided at nearly the same height (flush). A pinhole portion that is able to allow light to pass through is provided on the upper surface of the upper plate. A material that has light blocking properties, such as chrome, is used to cover areas of the upper surface other than the pinhole portion.

In addition, a spatial image measurement sensor such as that disclosed in Japanese Laid-Open Publication No. 2002-

14005, for example, is provided as an optical sensor at the prescribed position outside the plate member 356 on the Z tilt stage 352 (substrate stage PST). The spatial image measurement sensor comprises an upper plate that is rectangular in a planar view. The upper surface of the upper plate is a nearly flat surface, and it may be used as the reference plane of the focus leveling detection system. In addition, the upper surface of the upper plate is such that the surface of the substrate W and the surface (flat surface) 357 of the plate member 356 are provided at nearly the same height (flush). A slit portion that is able to allow light to pass through is provided on the upper surface of the upper plate. A material that has light blocking properties, such as chrome, is used to cover areas of the upper other than the slit portion.

In addition, an irradiation amount sensor (illumination intensity sensor) such as that disclosed in Japanese Laid-Open Publication No. H11-16816, for example, is provided on the Z tilt stage 352 (substrate stage PST), the upper surface of the upper plate of that irradiation amount sensor is provided at nearly the same height (flush) as the substrate W surface and the plate member 356 surface (flat surface) 357.

The exposure apparatus EX of the present embodiment projection exposes the pattern image of the mask M on the substrate W while moving the mask M and the substrate W in the X axis direction (scanning direction), and, during scanning expose the pattern image of a portion of the mask M is projected within the projection region AR1 via the liquid LQ of liquid immersion region AR2 and the projection optical system PL, and in synchronization with the mask M moving in the −X direction (or the +X direction) at a velocity V, the substrate W moves in the +X direction (or the −X direction) with respect to the projection region AR1 at a velocity β·V (where β is the projection magnification). Then, a plurality of shot regions are set on the substrate W, and after exposure to one shot region has been completed, the next shot region moves to the scanning start position by means of the stepping movement of the substrate W, and thereafter the scanning exposure process for the respective shot regions is sequentially performed while moving the substrate W by a step and scan system.

Figure 11:
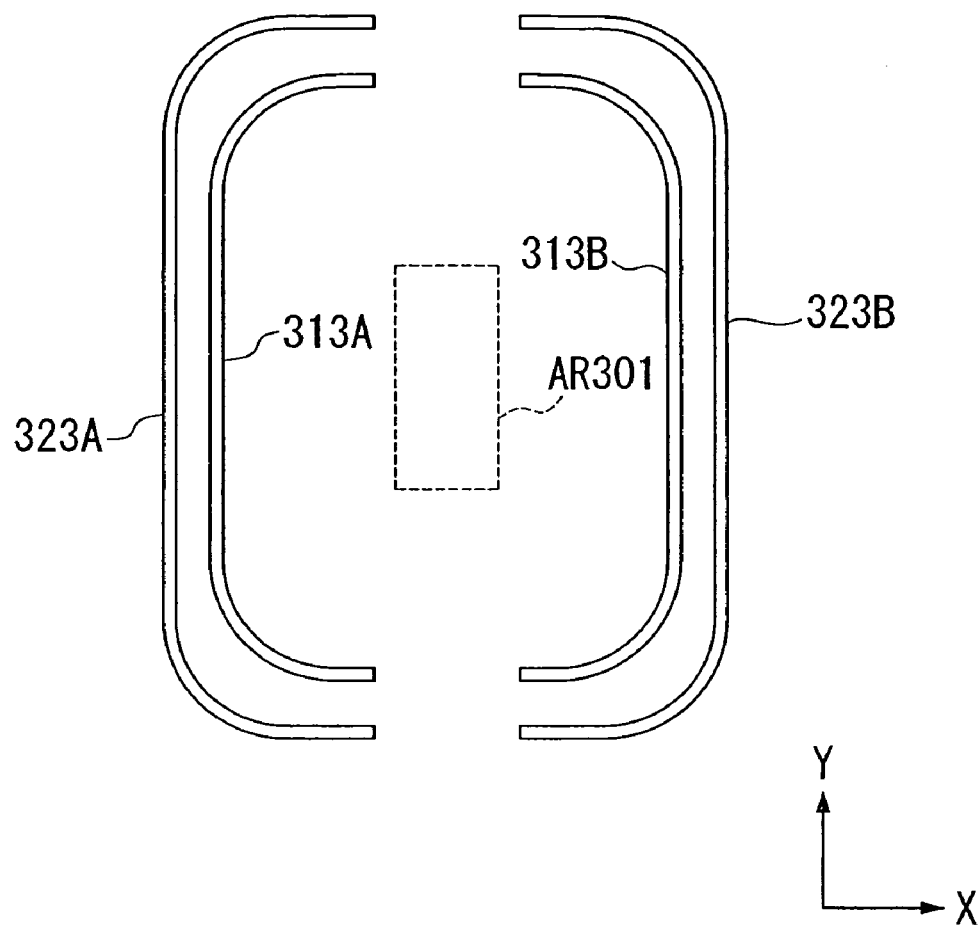
FIG. 11 is a plan view that shows the positional relationship between the liquid supply port, the liquid recovery port and the projection region of the projection optical system.

FIG. 11 is a front view that shows the positional relationship between the liquid supply port 313, the liquid recovery port 323 and the projection region AP301. As shown in FIG. 11, projection region AR1 of the projection optical system PL is provided in a shape that is rectangular in a planar view that has the Y axis direction as the lengthwise direction and the X axis direction as the short direction.

In relation to the X axis direction (scanning direction), liquid supply ports 313A and 313B are respectively provided on both sides interposing the projection region AR301 of the projection optical system PL. Specifically, liquid supply port 313A is provided at one side (−X side) of the direction with respect to projection region AR301, and liquid supply port 313B is provided on the other side (+X side) of the lower surface 370S of the channel formation member 370. That is, the liquid supply ports 313A, 313B are provided near projection region AR301 and arranged on both sides thereof so as to interpose projection region AR1 in relation to the scanning direction (X axis direction). The liquid supply ports 313A, 313B are respectively formed as slits that are approximately u-shaped in a planar view extending in the Y axis direction. In addition, the lens of the liquid supply ports 313A, 313B in the Y axis direction are at least longer than the length of the projection region AR301 in the Y axis direction. Liquid supply ports 313A and 313B are provided so that they at least surround projection region AR301. The liquid supply mechanism 310 is able to simultaneously supply liquid LQ on both sides of projection region AR1 via the liquid supply ports 313A, 313B.

The liquid recovery ports 323A, 323B are provided further to the outside with respect to projection region AR301 of the projection optical system PL than the liquid supply ports 313A, 313B of the liquid supply mechanism 310, and in relation to the X axis direction (scanning direction), they are respectively provided on both sides interposing the projection region AR301 of the projection optical system PL. Specifically, liquid recovery port 323A is provided at one side (−X side) of the scanning direction with respect to projection region AR301, and liquid recovery port 323B is provided on the other side (+X side) of the lower surface 370S of the channel formation member 370. The liquid recovery ports 323A, 323B are respectively formed as slits that are approximately u-shaped in a planar view extending in the Y axis direction. Liquid recovery ports 323A and 323B are provided so that they surround projection region AR301 of the projection optical system PL and the liquid supply ports 313A, 313B.

In addition, the liquid immersion region AR302 that is filled with the liquid LQ is within a region essentially surrounded by the two liquid recovery ports 323A, 323B so that projection region AR301 is included, and they are locally formed at a portion above the substrate W. Note that liquid immersion region AR302 should at least cover projection region AR301, and the entire region surrounded by the two liquid recovery ports 323A, 323B need not be a liquid immersion region.

Note that the configuration is such that the liquid supply ports 313 are respectively provided one by one to both sides of the projection region AR301, but they may be plurally divided, and there may be any number of them. Similarly, the liquid recovery ports 323 may also be plurally divided. In addition, the respective liquid supply ports 313 provided on both sides of the projection region AR301 formed to be nearly the same size (length) as each other, but they may be mutually different sizes. In the same way, the respective liquid recovery ports 323 provided on both sides of the projection region AR301 may be mutually different sizes. The slit width of supply port 313 may be the same as the slit width of the recovery port 323, the slit width of recovery port 323 may be larger than the slit width of supply port 313, and, conversely, the slit width of the recovery port 323 may be smaller than the slit width of the supply port 313.

Figure 12:
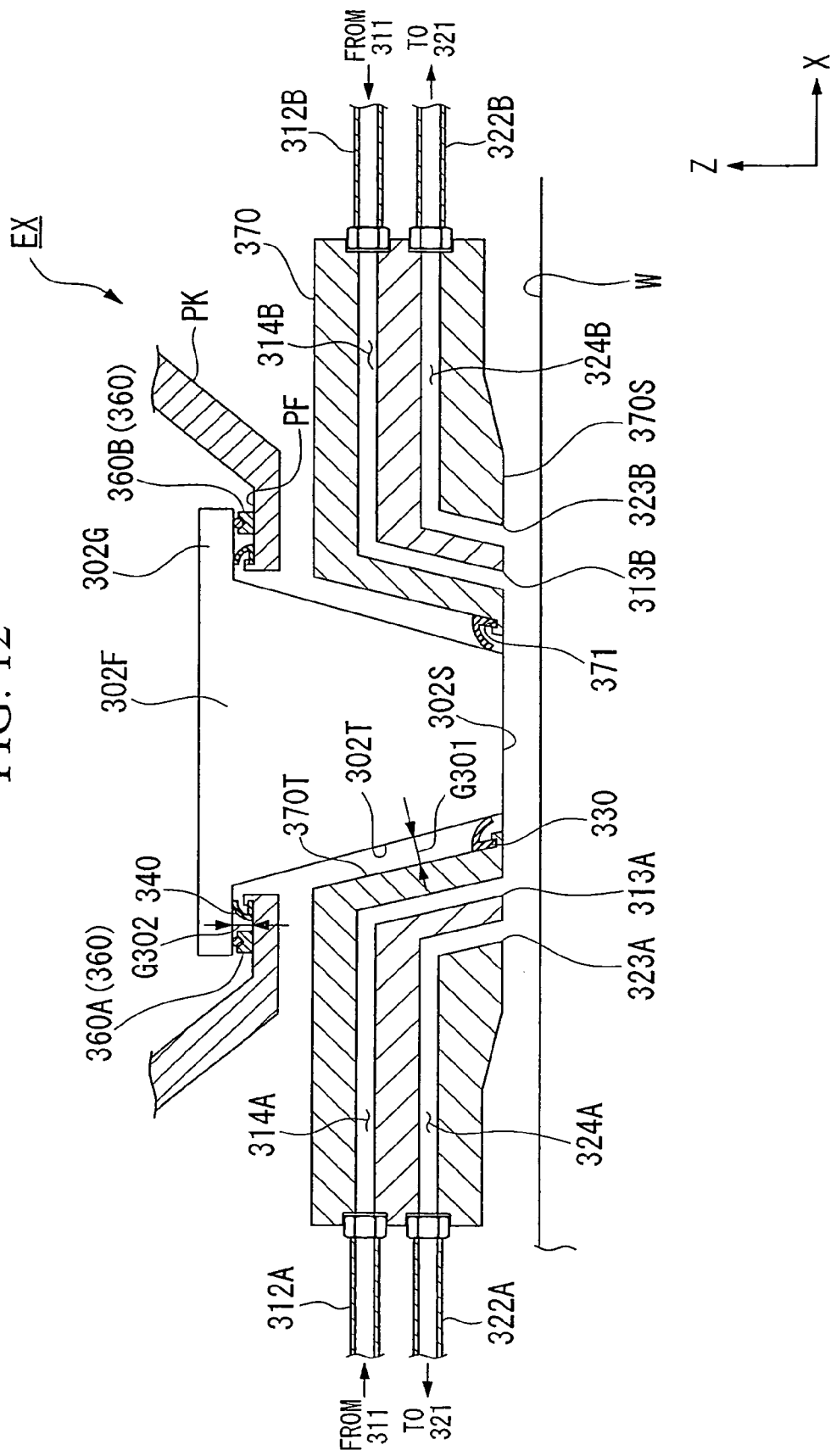
FIG. 12 is an enlarged cross-sectional view of the vicinity of the optical element and the channel formation member.

FIG. 12 is an enlarged cross-sectional view of the vicinity of the channel formation member 370. As shown in FIG. 12, a gap G301 is provided between the side surface 302T of optical element 302F of the projection optical system PL and the inner side surface 370T of the channel formation member 370. The gap G301 is provided to vibrationally separate optical element 302F of the projection optical system PL and the channel formation member 370. The gap G301 is set to approximately 3 to 10 mm for example. In addition, each of the liquid supply mechanism 310 and the liquid recovery mechanism 320, which include the channel formation member 370, and the projection optical system PL are supported by separate support mechanisms, and they are vibrationally separated. Through this, the vibration generated in the liquid supply mechanism 310 and the liquid recovery mechanism 320, which include the channel formation member 370, can be prevented from being transmitted to the projection optical system PL side.

A flange portion 302G is formed on the upper portion of optical element 302F, and a support surface PF that opposes the flange portion 302G is formed on the lower end portion of the barrel PK. In addition, a support portion 360 that kinematically supports optical element 302F is provided on the support surface PF of the barrel PK. A gap G302 is provided between the lower surface of the flange portion 302G of optical element 302F supported on the support portion 360 and the support surface PF of the barrel PK.

In addition, the exposure apparatus EX is provided with a first seal member 330 that blocks the penetration of liquid LQ between the channel formation member 370 and the side surface 302T of optical element 302F that comes into contact with the liquid LQ of the liquid immersion region AR302 formed on the substrate W from among the plurality of optical elements 302A to 302F that comprise the projection optical system PL.

In addition, the exposure apparatus EX comprises a second seal member 340 that blocks the flow of gas between optical element 302F and the barrel PK that holds that optical element 302F. The first seal member 330 is replaceably attached to the inner side surface 370T of the channel formation member 370 formed in a ring shape. The second seal member 340 is replaceably attached to the barrel PK.

Figure 13:
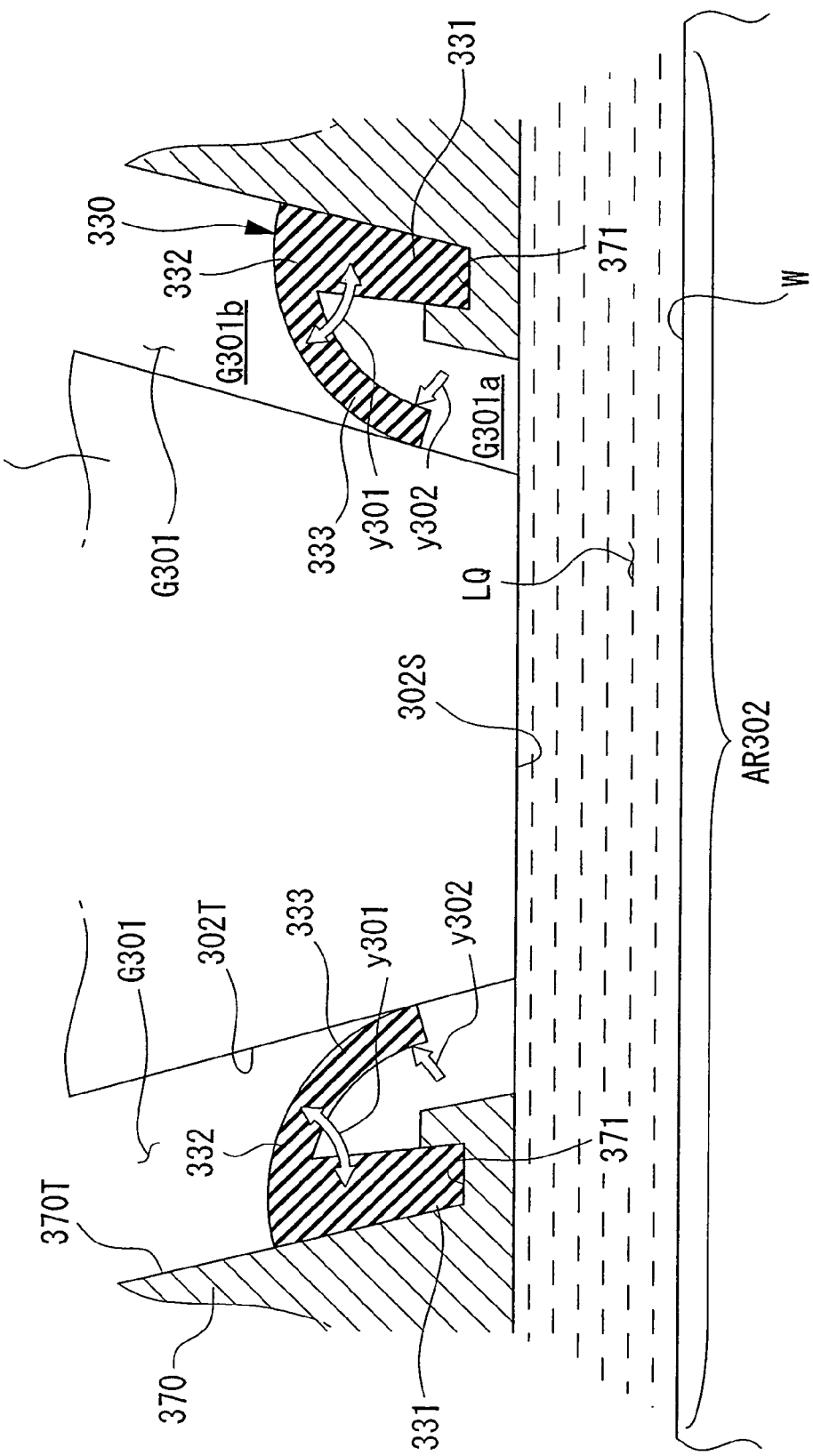
FIG. 13 is an enlarged cross-sectional view that shows the vicinity of the first seal member.

FIG. 13 is an enlarged cross-sectional view that shows the vicinity of the first seal member 330. As shown in FIG. 13, the first seal member 330 is provided between the side surface 302T of optical element 302F and the inner side surface 370T of the channel formation member 370, and it blocks the liquid LQ of the liquid immersion region AR302 formed on the substrate W from penetrating between the side surface 302T of optical element 302F and the inner side surface 370T of the channel formation member 370. The first seal member 330 is formed in a ring shape so as to surround optical element 302F.

The first seal member 330 has flexibility. In addition, the first seal member 330 is liquid repellent. In the present embodiment, the first seal member 330 is formed of fluorine rubber. Fluorine rubber is desirable in that while it is flexible and liquid repellent, it has little outgas, it is insoluble in liquid LQ, and it has little effect on exposure processing. Note that, for the first seal member 330, a liquid repellent material may be coated onto the surface of a ring-shaped member formed using a prescribed material that has flexibility.

The first seal member 330 formed in a ring shape so as to surround optical element 302F comprises a main unit portion 331 attached to the inner side surface 370T of the channel formation member 370 and a contact portion 333 that connects to the main unit portion 331 via a hinge portion 332 and comes into contact with the side surface 302T of optical element 302F. The contact portion 333 is an approximately annular ring-shape (conical) member.

A concave portion 371 that is able to hold the main unit portion 331 of the first seal member 330 is formed in the vicinity of the lower end portion of the inner side surface 370T of the channel formation member 370. The concave portion 371 is formed approximately in an annular ring shape in a planar view so that it follows the inner side surface 370T of the channel formation member 370. By fitting the main unit portion 331 of the first seal member 330 into the concave portion 371, the main unit portion 331 is attached in the vicinity of the lower end portion of the inner side surface 370T of the channel formation member 370. Then, the contact portion 333 comes into contact with the vicinity of the lower end portion of the side surface 302T of optical element 302F in a status in which the main unit portion 331 of the first seal member 330 is attached to the inner side surface 370T (concave portion 371) of the channel formation member 370. The contact portion 333 is made thinner than the main unit portion 331, and it is able to greatly bend is a status in which it is in contact with the side surface 302T of optical element 302F.

The hinge portion 332 connect the main unit portion 331 and the contact portion 333, and elastic deformation in the direction shown by arrow y301 in FIG. 13 is possible. In addition, the contact portion 333 generate force in the direction of pushing the side surface 302T of optical element 302F (see arrow y302) in a status in which the main unit portion 331 of the first seal member 330 is attached to the inner side surface 370T of the channel formation member 370. Through this, the contact portion 333 and the side surface 302T of optical element 302F closely adhere. Through this, penetration of the liquid LQ of the liquid immersion region AR302 into the gap G301 between the side surface 302T of optical element 302 and the channel formation member 370 is blocked.

In addition, the contact portion 333 has flexibility, so even if vibration is generated by the channel formation member 370 for example, it can be absorbed by the contact portion 333 bending or the hinge portion 332 elastically deforming. Therefore, it is possible to prevent the vibration generated by the channel formation member 370 from being transmitted to optical element 302F of the projection optical system PL. In addition, by the contact portion 333 bending or the hinge portion 332 elastically deforming, it is possible to reduce the force that the first seal member 330 (contact portion 333) applies to optical element 302F. Therefore, it is possible to prevent nonconformities such as that in which optical element 302F warps and positional dislocation occurs.

Here, the force (energy imparting force) going in the direction of arrow y302 of the contact portion 333 is generated based on hinge portion 332 elastic deformation, but it is also generated by the pressure of the liquid LQ of the liquid immersion region AR302. Specifically, when the pressure of the liquid LQ of the liquid immersion region AR302 is made positive pressure, the pressure of the gap G301a of the lower side from the first seal member 330 of gap 301 becomes higher than the pressure of the gap 301b of the upper side. In addition, as shown in FIG. 13, contact portion 333 adheres to the side surface 302T of the optical element 302F in a status in which the upper end portion of the contact portion 333 is connected to the main unit portion 331 via a hinge portion 332, and the lower end portion thereof comes into contact with the side surface 302T of optical element 302F.

Note that, the configuration of the first seal member 330 shown in FIG. 13 is one example, the posture when the contact portion 333 (first seal member 330) has been installed or the position of the contact portion 333 with respect to the main unit portion 331 may be optimally set so that the contact portion 333 adheres to the side surface 302T of the optical element 302F by means of the pressure difference of space G301a and space G301b.

Note that, here, the main unit portion 331 of the first seal member 330 is attached to the channel formation member 370, and the contact portion 333 is connected to optical element 302F, but the main unit portion 331 of the first seal member 330 is attached to the side surface 302T of optical element 302F, and contact portion 333 may come into contact with the inner side surface 370T of the channel formation member 370.

In addition, the side surface 302T of optical element 302F that forms gap G301 and the inner side surface 370T that opposes side surface 302T of optical element 302F of the channel formation member 370 are respectively liquid repellent Specifically, the respective inner side surface 370T and side surface 302T are made liquid repellent by performing liquid repellence treatment. For the liquid repellence treatment, coating of a material that has liquid repellent properties such as a fluorine group resin material is performed, an acrylic group resin material and a silicon group resin material, or a thin film consisting of said material with liquid repellent properties is applied. In addition, the film for surface treatment may be a single layer film or a film consisting of a plurality of layers. On the other hand, as described above, the liquid contact surface 302S of optical element 302F of the projection optical system PL and the lower surface (liquid contact surface) 370S of the channel formation member 370 have lyophilic properties (hydrophilic properties).

Since the first seal member 330, side surface 302T of optical element 302F, and inner side surface 370T of the channel formation member 370 are respectively liquid repellent, in the case in which liquid LQ has penetrated to the gap G301 due to the capillary tube phenomenon for example, that penetrated liquid LQ is repelled and does not collect in gap G301. Therefore, the liquid LQ also does not stagnate in gap 301, thereby preventing the nonconformity whereby liquid LQ whose degree of cleanliness has dropped due to stagnation mixes into the liquid LQ of the liquid immersion region AR302 between optical element 302F and the substrate W.

Figure 14:
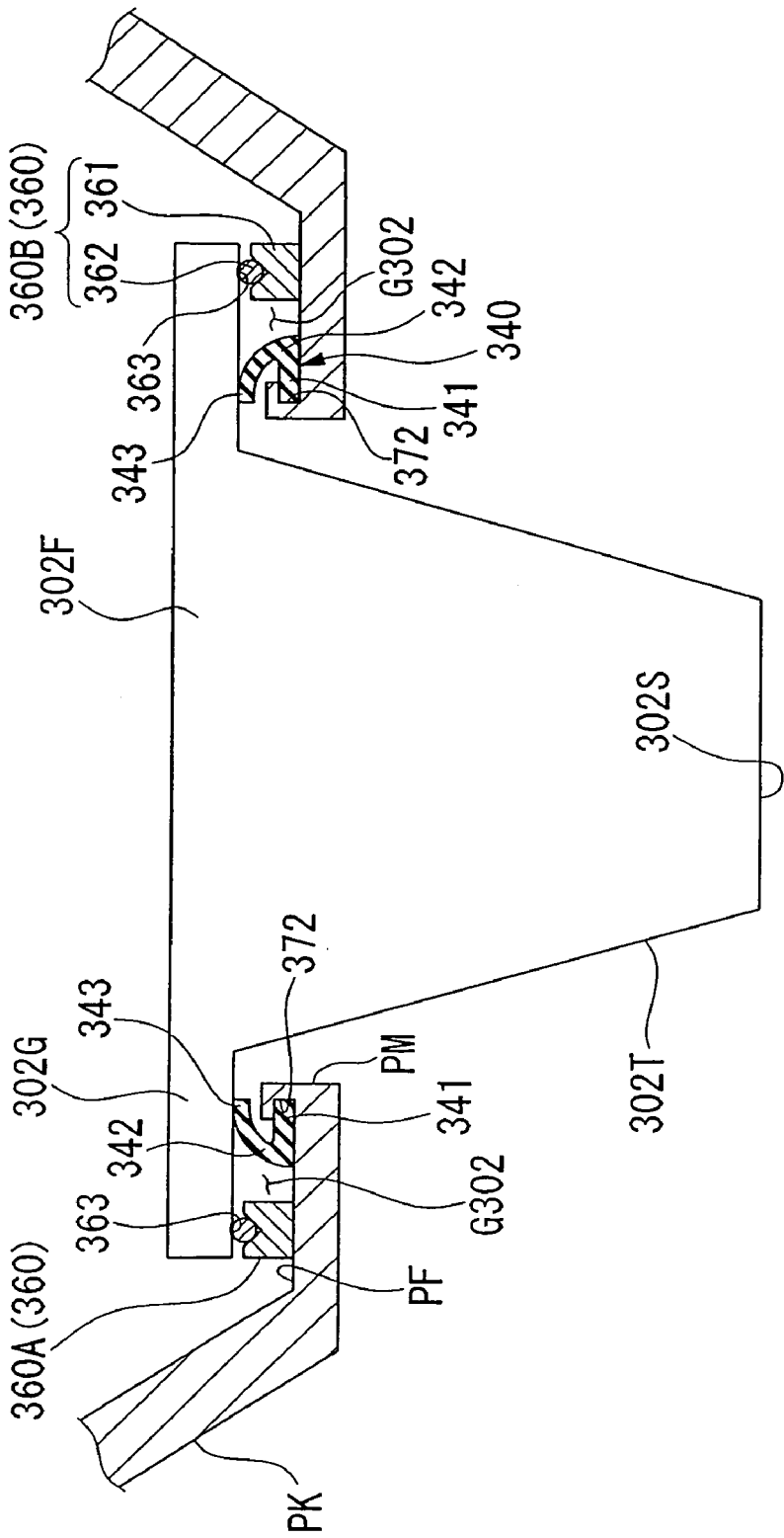
FIG. 14 is an enlarged cross-sectional view that shows the vicinity of the second seal member.

FIG. 14 is an enlarged cross-sectional view that shows the vicinity of the second seal member 340. A support portion 360 that kinematically supports optical element 302F via a flange portion 302G is provided on the support surface PF formed on the lower end portion of the barrel PK, and optical element 302F is kinematically supported via a support portion 360 on the support surface PF of the barrel PK. The support portions 360 are respectively provided at three prescribed locations on the support surface PF. Note that, in FIG. 14, support portion 360C of the three support portions 360A to 360C is not shown in the drawing.

Support portion 360 comprises a V groove member 361, which is provided on the support surface PF of the barrel PK, for example, and has a V-shaped inner surface, and a spherical member 362 that has a spherical surface that comes into contact with the V-shaped inner surface of the V groove member 361. Here, a spherical concave portion 363 in which said spherical member 362 can be arranged is formed on the lower surface of the flange portion 302G of optical element 302F, and the inner surface of the spherical concave portion 363 of the flange portion 302G of optical element 302F comes into contact with the spherical surface of the spherical member 362. Also, since both of these surfaces are slidable, for example, since both of these surfaces slide when the barrel PK becomes slightly deformed, the effects of the deformation of the barrel PK on the optical element 302F are restricted.

A gap G302 is provided between the flange portion 302G of optical element 302F, which is supported at three points by the support member 360 (360A to 360C) and the support surface PF of the barrel PK. In addition, a second seal member 340, which blocks the flow of gas between the optical element 302F and the barrel PK (support surface PF), is provided in the vicinity of the support portion 360. The second seal member 340 is formed in a ring shape so as to surround optical element 302F.

Note that, the support portion 360 is not limited to a configuration in which a V time [sic] member 361 and a spherical member 362 are provided. For example, the configuration of the support member 360 may be such that it comprises three seats provided at the lower end portion of the barrel PK and three optical element pressing members provided at positions that correspond to the three seats. In this support member configuration, one of the surfaces of the flange portion 302G of the optical element 302F is mounted on three seats, and optical element 302F is supported at three points. In addition, by providing the aforementioned pressing member on the other surface of the flange portion 302G of optical element 302G and interposing the flange portion 302G along with the three seats, it is possible to hold optical element 302F at the lower end portion of the barrel PK.

The second seal member 340 is provided between flange portion 302G of optical element 302F and support surface PF of the barrel PK, and the flow of gas between the interior space of the barrel PK and the exterior is blocked. Through this, the interior of the barrel PK goes into a nearly tightly sealed status, and as described above, a gas substitution apparatus 3 can be used to fill the interior of the barrel PK with an inert gas.

The second seal member 340 has a configuration that is nearly equivalent to that of the first seal member 330, and it is formed of fluorine rubber, for example, and is flexible and liquid repellent. In addition, in the aforementioned way, the fluorine rubber is preferred since it has little outgas and few effects on exposure treatment.

In addition, the second seal member 340, which is formed in a ring shape so as to surround optical element 302F, comprises a main unit portion 341 attached to the support surface PF of the barrel PK and a contact portion 343 that is connected to the main unit portion 341 via a hinge portion 342 and that comes into contact with the lower surface of the flange portion 302G of optical element 302F.

An aperture portion PM, which is capable of arranging optical element 302F, is formed on the lower end portion of the barrel PK, and a concave portion 372 that is capable of holding the main unit portion 341 of the second seal member 340 is formed in the vicinity of the aperture portion PM of the support surface PF of the barrel PK. The concave portion 372 is formed in a ring shape to follow the aperture portion PM. By fitting the main unit portion 341 of the second seal member 340 into the concave portion 372, that main unit portion 341 is attached to the support surface PF of the barrel PK. In the present embodiment, the second seal member 340 is arranged more on the optical element 302F side than the support portion 360 on the support surface PF. In addition, the contact portion 343 comes into contact with the lower surface of the flange portion 302G of optical element 302F in a status in which the main unit portion 341 of the second seal member 340 is attached to the support surface PF (concave portion 372) of the barrel PK. The contact portion 343 is made thinner than the main unit portion 341, and it is able to greatly bend is a status in which it is in contact with the flange portion 302G of optical element 302F.

The hinge portion 342 connects the main unit portion 341 and the contact portion 343, and it is capable of elastic deformation. In addition, the contact portion 343 generates force in the direction of pushing the flange portion 302G of optical element 302F in a status in which the main unit portion 341 of the second seal member 340 is attached to the support surface PF of the barrel PK. Through this, the contact portion 343 and the lower surface of the flange portion 302G of optical element 302F closely adhere. Through this, the flow of gas between the flange portion 302G of optical element 302F and the support surface PF of the barrel PK is blocked.

In addition, the contact portion 343 has flexibility, so even if vibration is generated by optical element 302F for example, it can be absorbed by the contact portion 343 bending or the hinge portion 342 elastically deforming. Therefore, it is possible to prevent the vibration generated by optical element 302F from being transmitted to the barrel PK. In addition, by the contact portion 343 bending or the hinge portion 342 elastically deforming, it is possible to reduce the force that the second seal member 340 (contact portion 343) applies to optical element 302F. Therefore, it is possible to prevent the occurrence of nonconformities such as that in which optical element 302F warps and positional dislocation occurs.

In addition, the force (energy imparting force) going in the direction of pushing the flange portion 302G of the contact portion 343 is generated based on hinge portion 342 elastic deformation, but it is also generated by the pressure difference of the space inside and outside the barrel PK. Therefore, it is preferable that the posture when the contact portion 343 (second seal member 340) has been installed, or the position of the contact portion 343 with respect to the main unit portion 341 be set so that the contact portion 343 closely adheres to the flange portion 302G of optical element 302F due to the pressure difference of the exterior and the interior space of the barrel PK.

Note that, here, the main unit portion 341 of the second seal member 340 is attached to the barrel PK, and the contact portion 343 is in contact with optical element 302F, but the main unit portion 341 of the second seal member 340 is attached to the flange portion 302G of optical element 302F, and contact portion 343 may come into contact with the support surface PF of the barrel PK.

In addition, the lower surface of the flange portion 302G of optical element 302F that forms gap G302 and the support surface PF that opposes the flange portion 302G of optical element 302F of the barrel PK may be made liquid repellent.

Next, the method of exposing the pattern image of the mask M on the substrate W using an exposure apparatus EX that has the above configuration will be explained.

In performing scanning exposure processing of the substrate W after the substrate W has been loaded on the substrate stage PST as the mask M is loaded on the mask stage MST, the control apparatus CONT drives the liquid supply mechanism 310 and starts the operation of liquid supply onto the substrate W. The liquid LQ supplied from the liquid supply portion 311 of the liquid supply mechanism 310 to form the liquid immersion region AR302 is supplied onto the substrate W from the liquid supply ports 313A, 313B via the supply channels 314A, 314B after passing through the supply tubes 312A, 312B.

Due to the liquid LQ that is supplied onto the substrate W, a liquid immersion region AR302 is formed between the projection optical system PL and the substrate W. Here, the liquid LQ that has passed through the supply tubes 312A, 312B expands in the width direction of supply channels 314A and 314B and liquid supply ports 313A and 313B formed in a slit shape and is supplied to a wide area on the substrate W. The liquid LQ that has been supplied onto the substrate W from liquid supply ports 313A and 313B is supplied so that it expands to wet between the substrate W and the lower side surface of the front end portion (optical element 302) of the projection optical system PL, and a liquid immersion region AR302 that is larger than the projection region AR301 and smaller than the substrate W is formed locally at a portion on the substrate W including the projection region AR301. At this time, the control apparatus CONT simultaneously performs supply of the liquid LQ onto the substrate W from both sides of the projection region AR301 by means of liquid supply ports 313A and 313B respectively, which are arranged on both sides of the X axis direction (scanning direction) of the projection region AR301 of the liquid supply mechanism 310.

In addition, the control apparatus CONT drives the liquid recovery portion 321 of the liquid recovery mechanism 320 and performs recovery of the liquid LQ on the substrate W in parallel with the driving of the liquid supply mechanism 310. In addition the control apparatus CONT controls driving of the liquid supply mechanism 310 and the liquid recovery mechanism 320 to form the liquid immersion region AR302.

While the control apparatus CONT performs recovery of the liquid LQ on the substrate W by means of the liquid recovery mechanism 320 in parallel with the supply of liquid LQ onto the substrate W by means of the liquid supply mechanism 310 and as it moves the substrate stage PST that supports the substrate W in the X axis direction (scanning direction), it projection exposes the pattern image of the mask M onto the substrate W via the projection optical system PL and the liquid LQ between the projection optical system PL and the substrate W. At this time, the liquid supply mechanism 310 simultaneously performs supply of the liquid LQ from both sides of the projection region AR301 in relation to the scanning direction via the liquid supply ports 313A, 313B, so the liquid immersion region AR302 is formed uniformly and well.

In the present embodiment, when the liquid LQ is supplied to the substrate W from both sides of the scanning direction of the projection region AR301, the control apparatus CONT uses the flow volume control instruments 316A, 316B of the liquid supply mechanism 310 to adjust the liquid supply volume per unit time and makes the liquid volume (the liquid supply volume per unit time) supplied from one side of the projection region AR301 in relation to the scanning direction during scanning exposure of one shot region on the substrate W different from the liquid amount supplied from the other side. Specifically, the control apparatus CONT sets the liquid supply volume per unit time supplied from in front of the projection region AR301 in relation to the scanning direction to be greater than the liquid supply volume supplied at the opposite side.

For example, when the substrate W is exposure processed while moving in the +X direction, the control apparatus CONT makes the liquid volume from the −X side (that is, liquid supply port 313A) with respect to the projection region AR301 larger than the liquid volume from the +X side (that is, liquid supply port 313B), and, on the other hand, in the case where the substrate W is exposure processed while moving in the −X direction, the liquid volume from the +X side with respect to the projection region AR301 is made larger than the liquid volume from the −X side. In this way, the control apparatus CONT changes the respective liquid supply volumes per unit time from liquid supply ports 313A, 313B according to the substrate W movement direction.

In addition, even if the liquid LQ of the liquid immersion region AR302 penetrates the gap G301 during liquid immersion exposure of the substrate W, that penetration is blocked by the first seal member 330.

In the case where the liquid LQ has penetrated the gap G301, force is applied to the side surface 302T of optical element 302F by that liquid LQ that penetrated the gap G301, and there is a possibility that a nonconformity such as optical element 302F deforming (warping) will occur. In any case, a first seal member 330 is provided, so it is possible to prevent nonconformities in which the side surface 302T of optical element 302F is subject to force from the liquid LQ.

In addition, the penetration of the liquid LQ to the gap G301 is blocked by the first seal member 330, so there is no pressure deformation resulting from the inflow and outflow of the liquid LQ with respect to the gap G301. Therefore, the nonconformity in which optical element 302F vibrates due to that pressure deformation is also prevented.

Also, if the liquid LQ penetrates the gap G301, there is a possibility that the penetrated liquid LQ will remain in the gap G301. When the liquid LQ remains in the gap G301 for a long time, there is a strong possibility that that liquid LQ will become polluted, and when that polluted liquid LQ of the gap G301 flows between the substrate W and the projection optical system PL during liquid immersion exposure of the substrate W for example, there is possibility that this will bring about deterioration of exposure accuracy. In any case, by not allowing the liquid LQ to penetrate the gap G301 by means of the first seal member 330, it is possible to prevent the nonconformity whereby the liquid LQ in the gap G301.

In addition, by preventing the penetration of liquid LQ or liquid LQ splashes between the side surface 302T of optical element 302F and channel formation member 370 by means of the first seal member 330, it is possible to prevent the nonconformities whereby rust occurs on the side surface 370T of the channel formation member 370 and the barrel PK, and the side surface 302T, for example, of optical element 302F dissolves.

In addition, by providing a second seal member 340, even in a configuration in which the interior space of the barrel PK is filled with an inert gas, it is possible to prevent the penetration of external gas to that interior space.

Therefore, it is possible to maintain the environment of the interior space of the barrel PK. In addition, the liquid LQ of the liquid immersion region AR302 on the substrate W is vaporized, and there is a possibility that that vaporized moist gas will penetrate the interior of the barrel PK via gap G301 and gap G302, and in that case, there is a possibility that the nonconformity whereby rust occurs on the inner wall surface of the barrel PK causing the optical elements 302A to 302E of the interior of the barrel PK to dissolve will occur. However, it is possible to prevent the penetration of that moist gas to the interior of the barrel PK by means of the first seal member 330 and the second seal member 340, so the occurrence of the above nonconformity can be avoided.

Note that in the above embodiment, the configuration is such that optical element 302F performs exposure from the barrel PK, and the side surface 302T of optical element 302F opposes the inner side surface 370T of the channel formation member 370, but the side surface 302T of optical element 302 may also be held by a portion (front end portion) of the barrel PK or a holding member (lens cell) that is separate from the barrel PK. In this case, the side surface of said barrel PK or the side surface of the lens cell opposes the inner side surface 370T of the channel formation member 370. In such a case the seal member 330 is attached so that the penetration of the liquid LQ between the side surface of the lens cell (or barrel) that holds optical element 302F and the channel formation member 370 is blocked.

Note that in the aforementioned embodiment, liquid supply ports 313A and 313B, which supply the liquid LQ, and liquid recovery ports 323A and 323B, which recover the liquid LQ, are formed on one lower surface 370S of the channel formation member 370, but, for example, as in the configuration explained in the first embodiment, the channel formation member (supply member) that has liquid supply ports 313A and 313B and the channel formation member (recovery member) that has liquid recovery ports 323A and 323B may also be separately provided.

Note that, in the above embodiment, the case in which a liquid immersion region AR302 of the liquid LQ is formed on the substrate W was explained, but there are also cases such as that described above in which a liquid immersion region AR302 of the liquid LQ is formed on the upper surface of the reference member provided on the substrate stage PST. In addition, there are cases in which the various measurement processing is performed via the liquid LQ of the liquid immersion region AR302 on that upper surface. In those cases as well, it is possible to perform measurement processing well by preventing the penetration of the liquid LQ to the gap G301 by the first seal member 330 while blocking the flow of gas in the gap G302 by means of the second seal member 340. In the same way, it is possible to perform measurement processing well in the case in which measurement processing is performed by forming a liquid immersion region AR302 of the liquid LQ on the upper surface of the upper plate of the illumination irregularity sensor or on the upper surface of the upper plate of the spatial image measurement sensor. In addition, a configuration in which a liquid immersion region AR302 is formed on the upper surface of the Z tilt stage 352 (substrate stage PST) is also conceivable, and in that case as well, it is possible to prevent the penetration of the liquid LQ to the gap G301 by the first seal member 330 while blocking the flow of gas in the gap G302 by means of the second seal member 340.

Note that, in the aforementioned embodiment, a porous body such as a sponge-shaped member or porous ceramics may also be arranged on liquid supply port 313, liquid recovery port 323 and the liquid supply channel 314 and recovery channel 324 connected thereto.

Figure 15:
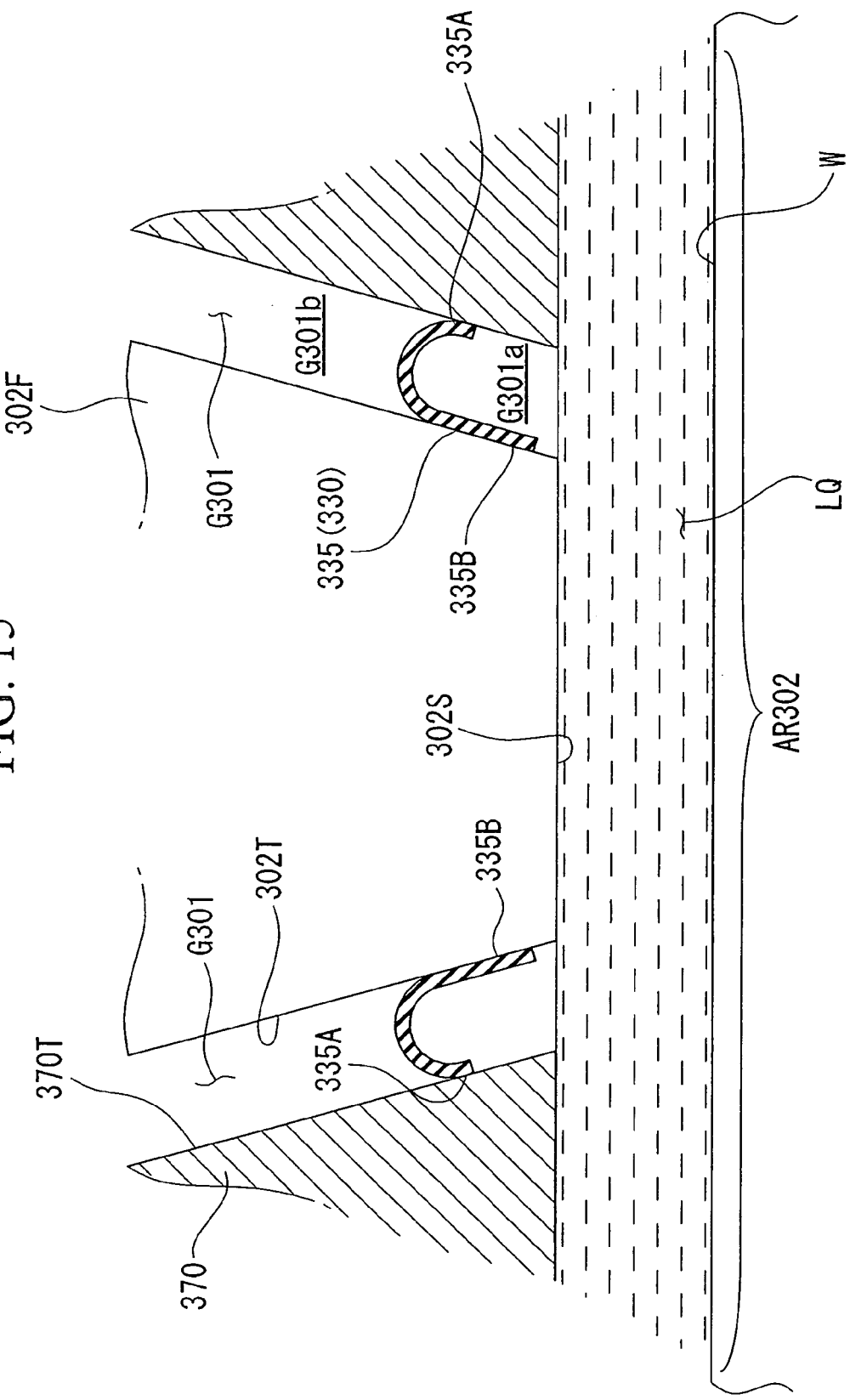
FIG. 15 is a cross-sectional view that shows a separate embodiment of the first seal member.

Note that it is possible to use a sheet-shaped member 335 such as that shown in FIG. 15 as the first seal member (or the second seal member). The sheet-shaped member 335 is formed in an annular ring shape in a planar view (cone shape), and the outer edge portion 335A of the sheet-shaped member 335 is attached to the inner side surface 370T of the channel formation member 370, and the inner edge portion 335B comes into contact with the side surface 302T of optical element 302F. The outer edge portion 335A is secured to the inner side surface 370T of the channel formation member 370 by a bonding agent for example.

In addition, the inner edge portion 335B of the sheet-shaped member 335 closely adheres to the side surface 302T of optical element 302F by means of the pressure difference between gap G301$a$ of the lower side of the sheet-shaped member 335 and gap G301$b$ of the upper side of gap G301. Through this, penetration of the liquid LQ between the side surface 302T of optical element 302F and the channel formation member 370 is blocked.

Here, in addition to the liquid LQ of the liquid immersion region AR302 formed on the substrate W, it is also possible to prevent the penetration of moist gas that has been vaporized from that liquid LQ into gap G301 by using a gas barrier sheet (gas shield sheet) that restricts the flow of gas as the sheet-shaped member 335.

It is possible to use a gas barrier sheet that is configured by laminating an expansion film, a bonding agent layer, a metal film, and an isolation film in that order. It is preferable that the isolation film be formed of a material that has excellent shielding ability with respect to gas (gas barrier ability) and that has extremely low outgas, for example, ethylene vinyl alcohol resin (EVOH resin). For this EVOH resin, it is possible to use "EVAL" (product name) made by Kuraray for example. As for other materials, Kapton (made by DuPont), Mylar (made by Dupont), Microtron (made by Toray), Bekusuta (made by Kuraray), Lumilar (made by Toray), etc. may be used.

Note that the inner edge portion 335B of the sheet-shaped member 335 may be secured on the side surface 302T of optical element 302F, and the outer edge portion 335A may be brought into contact with the inner side surface 370T of the channel formation member 370.

In any case, in the aforementioned way, it is preferable that the first seal member 330 and the second seal member 340 each be water repellent. On the other hand, there is a possibility that the liquid repellence properties of the first seal member 330 and the second seal member 340 will deteriorate due to exposure light EL being irradiated. Particularly in the case in which a fluorine group resin, for example, is used as the first and second seal members 330, 340 and ultraviolet light is used as the exposure light EL, the liquid repellence properties of those seal members 330, 340 tend to deteriorate (tend to become lyophilic). Therefore, by replacing the first and second seal members 330, 340 according to the exposure light EL irradiation time and the integrated irradiation amount, it is possible to put into place first and second seal members 330, 340 that have the prescribed liquid repellence properties.

In the aforementioned way, the liquid LQ in the first embodiment and the second embodiment consists of demineralized water. Demineralized water has advantages in that it can be easily obtained in large quantity at semiconductor manufacturing plants, etc. and in that it has no adverse effects on the photoresist on the substrate W or on the optical elements (lenses), etc. In addition, demineralized water has no adverse effects on the environment and contains very few impurities, so one can also expect an action whereby the surface of the substrate W and the surface of the optical element provided on the front end surface of the projection optical system PL are cleaned. Note that if the purity of the demineralized water supplied from the plant, etc. is low, the exposure apparatus may have ultra-pure water purifiers.

In addition, the index of refraction n of demineralized water (water) with respect to exposure light EL with a wavelength of approximately 193 nm is nearly 1.44, so in the case where ArF excimer laser light (193 nm wavelength) is used as the light source of the exposure light EL, on the substrate W, it is possible to shorten the wavelength to 1/n, that is, approximately 134 nm, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

Note that, when the liquid immersion method is used in the aforementioned way, the numerical aperture NA of the projection optical system may also become 0.9 to 1.3. In this way, in the case in which the numerical aperture NA of the projection optical system is made larger, there are case in which image formation performance deteriorates due to a polarization effect with the random polarized light conventionally used as the exposure light, so it is preferable that polarized light illumination be used. In that case, linear polarization illumination to match the lengthwise direction of the line pattern of the line and space pattern of the mask (reticle) is performed, and refracted light of the S polarization component (TE polarization component), that is, the polarization direction component along the lengthwise direction of the line pattern, may be irradiated from the mask (reticle) pattern in large quantities. In the case in which the space between the projection optical system PL and the resist coated onto the surface of the substrate W is filled with a liquid, the transitivity of the refracted light of the S polarization component (TE polarization component) at the resist surface, which contributes to the improvement of contrast is higher than that of the case in which the space between the projection optical system PL and the resist coated onto the of the surface of the substrate W is filled with air (gas), so high image formation performance can be obtained even in such cases as when the numerical aperture NA of the projection optical system PL exceeds 1.0. In addition, it is even more effective when a phase shift mask or a grazing incidence illumination method (particularly, the dipole illumination method) matching the lengthwise direction of the line pattern such as that disclosed in Japanese Laid-Open Publication No. H6-188169 is appropriately combined.

In addition, for example, in the case where an ArF excimer laser is used as the exposure light, and a projection optical system PL with a reduction rate of approximately ¼ is used to expose a minute line and space pattern (for example, a line and space of approximately 25 to 50 nm) on the substrate W, depending on the structure of the mask M (for example, the degree of minuteness of the pattern and the thickness of the chrome), the mask M acts as a polarization plate due to the wave guide effect, and more refracted light of the S polarization component (TE polarization component) is irradiated from the mask M than refracted light of the P polarization component (TM polarization component), which reduces contrast, so it is preferable that the above linear polarization illumination be used, but even if the mask M were illuminated by random polarized light, it would be possible to obtain high resolution performance even in the case in which the numerical aperture NA of the projection optical system PL becomes large at 0.9 to 1.3. In addition, in a case such as one where an extremely minute line and space pattern on the mask M is exposed onto the substrate W, there is a possibility that the P polarization component (TM polarization component) will be larger than the S polarization component (TE polarization component) due to the wire grid effect, but, for example, in the case in which an ArF excimer laser is used as the exposure light, a projection optical system PL with a reduction rate of approximately ¼ is used to expose a line and space pattern larger than 25 nm on the substrate W, more refracted light of the S polarization component (TE polarization component) is irradiated from the mask M than refracted light of the P polarization component (TM polarization component), so it would be possible to obtain high resolution performance even in the case in which the numerical aperture NA of the projection optical system PL becomes large at 0.9 to 1.3.

In addition, as disclosed in Japanese Laid-Open Publication No. H6-53120, not only linear polarization illumination (S polarization illumination) that matches the lengthwise direction of the line pattern of the mask (reticle) but a combination of a polarization illumination method that linearly polarizes in the circular connection (circumferential) direction centering on the optical axis and the grazing incidence method is also effective. In particular, in the case where not only a line pattern in which the pattern of the mask (reticle) extends in the prescribed direction but a line pattern that extends in a plurality of different directions is intermingled, as disclosed in the same Japanese Laid-Open Publication No. H6-53120, by jointly using a polarization illumination method that linearly polarizes in the circular connection direction centering on the optical axis and the annular illumination method, it is possible to obtain high resolution performance even in the case in which the numerical aperture NA of the projection optical system is large.

In the present embodiment, an optical element is attached to the front end of the projection optical system PL, and it is possible to use this lens to adjust the optical characteristics of the projection optical system PL, for example, aberration (spherical aberration, comatic aberration, etc.). Note that, the optical element to be attached to the first end of the projection optical system PL may also be an optical plate used in adjustment of the optical characteristics of the projection optical system PL. Or, it may be a parallel flat surface plate that is able to transmit exposure light EL.

Note that, in the present embodiment, the configuration is such that a liquid LQ is used to fill the space between the projection optical system PL and the surface of the substrate W, but it may also be a configuration in which liquid LQ is filled in a status in which a cover glass consisting of a parallel flat plate is attached to the surface of the substrate W for example.

Note that, in the present embodiment, the liquid LQ is water, but it may be a liquid other than water. For example, if the light source of the exposure light EL is an $F_2$ laser, this $F_2$ laser light will not pass through water, so the liquid LQ may be, for example, a fluorine group fluid, for example, a fluorocarbon oil or a perfluoropolyether (PFPE), which $F_2$ laser light is able to pass through. In this case, lyophilic treatment is performed on the portion that comes into contact with the liquid LQ by forming a thin film using a substance with a molecular structure with a small polarity that includes fluorine for example. In addition, it is also possible to use a liquid LQ that is permeable by the exposure light EL and whose active index is as high as possible and that is stable with respect to the photoresist coated on the projection optical system PL and the surface of the substrate P [sic] substrate W (for example, cedar oil). In this case as well, surface treatment is performed according to the polarity of the liquid LQ used.

Note that, in the invention of the present application, it is important that the configuration described in the first embodiment and the configuration described in the second embodiment may be appropriately replaced and combined.

Note that, applicable as the substrate W of the aforementioned respective embodiments are not only a semiconductor wafer for the manufacture of semiconductor devices but glass substrates for display devices, ceramic wafers for thin film magnetic heads, or mask or reticle base plates, etc. (synthetic quartz, silicon wafer) used in exposure apparatuses.

In addition, in the embodiments described above, an exposure apparatus that locally fills the space between the projection optical system PL and the substrate W with liquid is employed, but the present invention may also be applied to a liquid immersion exposure apparatus which moves the stage that holds the substrate subject to exposure in a liquid tank, such as that disclosed in Japanese Laid-Open Publication No. H6-124873 and to a liquid immersion exposure apparatus that forms a liquid tank of a prescribed depth on a stage and holds the substrate therein, such as that disclosed in Japanese Laid-Open Publication No. H1-303114.

Applicable as the exposure apparatus EX are, in addition to step and scan system scanning exposure apparatus (scanning steppers) that move the reticle R and the substrate W in synchronization and scan expose the pattern of a reticle R, step and repeat system projection exposure apparatuses (steppers) that expose the pattern on the reticle R all at once in a status in which the reticle R and the substrate W have been made stationary and sequentially step move the substrate W. In addition, the present invention is also applicable to step and switch system exposure apparatuses that partially stack and transfer at least two patterns on the substrate W.

In addition, the present invention can also be applied to twin stage exposure apparatuses that separately mount the substrate to be treated, such as a wafer, and are provided with two stages that are independently movable in the XY direction as disclosed in, for example, Japanese Laid-Open Publication Nos. H10-163099 and H10-214783, and Published Japanese Translation No. 2000-505958 of the PCT International Application.

The types of exposure apparatuses EX are not limited to exposure apparatuses for semiconductor element manufacture that expose a semiconductor element pattern onto a substrate W but are also widely applicable to exposure apparatuses for the manufacture of liquid crystal display elements and for the manufacture of displays, and exposure apparatuses for the manufacture of thin film magnetic heads, image pickup elements (CCD) or reticles or masks.

In the case where a linear motor is used in the substrate stage WST or the reticle stage RST (see U.S. Pat. No. 5,623,853 or U.S. Pat. No. 5,528,118), an air floating type uses air bearings or a magnetic levitation type that uses Lorentz's force or reactance force may be used as the system that causes the stages to float with respect to a table. In addition, the respective stages WST, RST may be the types that move along a guide or may be the guideless type in which a guide is not provided.

For the drive mechanisms of the respective stages WST, RST, a planar motor that places in opposition a magnet unit that two-dimensionally arranges magnets and an armature unit that arranges coils two-dimensionally and drives the respective stages WST, RST by elecromagnetic force may be used. In such a case, either the magnet unit or the armature unit is connected to the stage WST, RST, and the other from among the magnet unit and the armature it may be provided on the moving surface side of the stage WST, RST.

The reaction force generated by the movement of the substrate stage WST may be caused to mechanically escape to the floor (ground) using a frame member so that it is not transmitted to the projection optical system PL as described in Japanese Laid-Open Publication No. H8-166475 (U.S. Pat. No. 5,528,118). The reaction force generated by the movement of the reticle stage RST may be caused to mechanically escape to the floor (ground) using a frame member so that it is not transmitted to the projection optical system PL as described in Japanese Laid-Open Publication No. H8-330224 (U.S. Ser. No. 08/416,558).

The exposure apparatus EX of the present embodiment is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems.

The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Figure 16:
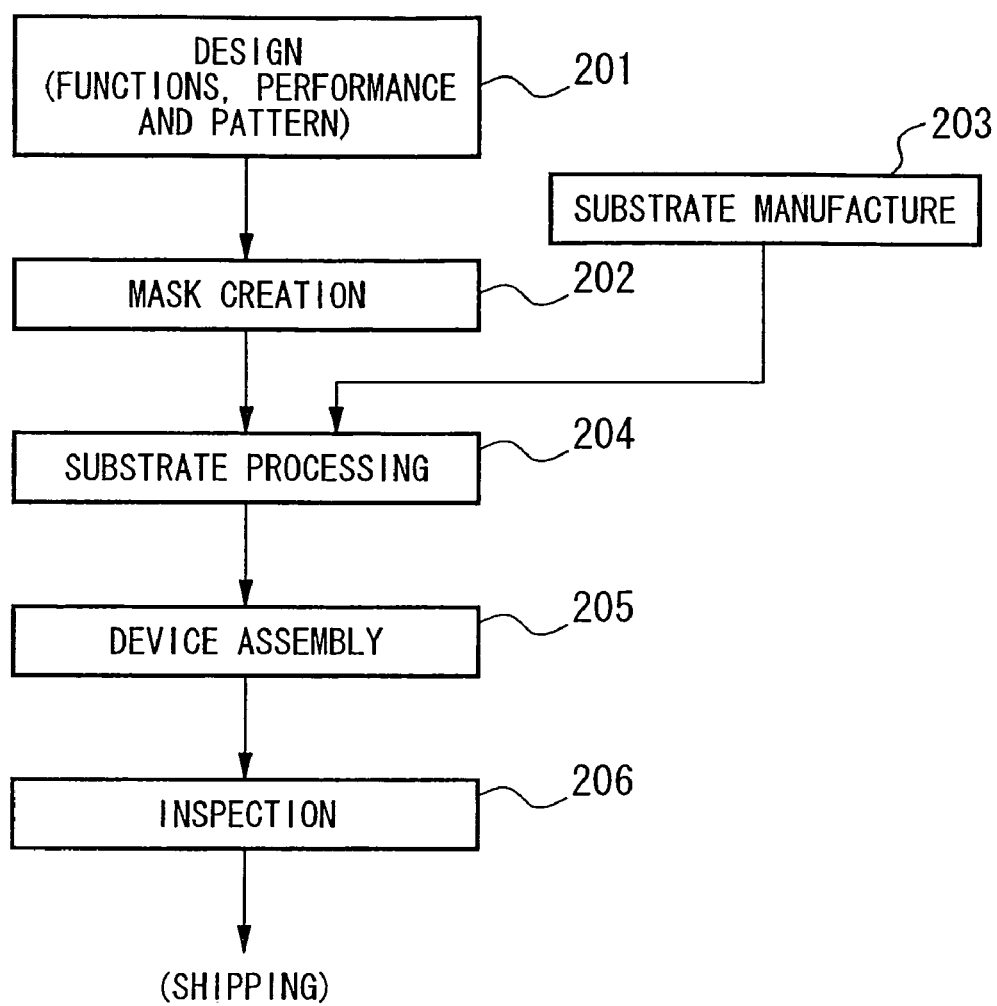
FIG. 16 is a flow chart that shows an example of the manufacturing process of the semiconductor device.

As shown in FIG. 16, microdevices such as semiconductor devices are manufactured by going through a step 201 that performs microdevice function and performance design, a step 202 that creates the reticle (mask) based on this design step, a step 203 that manufactures the substrate that is the device base material, a substrate processing step 204 that exposes the pattern on the reticle onto a substrate by means of the exposure apparatus EX of the aforementioned embodiment, a device assembly step (including the dicing process, bonding process and packaging process) 205, an inspection step 206, etc.

Note that, in step 204 in FIG. 10 in which the exposure apparatus EX is used, a coater developer (C/D) apparatus that is connected inline with the exposure apparatus EX is also used. In a common semiconductor manufacturing line, a wafer coated with a resist at the coater portion of the C/D apparatus is automatically conveyed from the coater portion to the prealignment portion inside the exposure apparatus EX by a robot arm or a slider arm. The prealignment portion in the exposure apparatus EX conveys the wafer onto the stage WST after the rotation directions of the notches and orientation flat of the wafer have been placed in the prescribed directions. Immediately before the conveyance operation of this unexposed wafer, the exposed wafer on the stage WST is carried out from the stage WST by means of an unloading arm, etc., and it is automatically transported to the developer portion of the C/D apparatus. At this time, the liquid immersion region AR2 goes into an atmospheric release status due to the recovery of the liquid that was being retained, but there are cases where water drops, etc. remain on the front surface or the back surface of the exposed wafer. Therefore, drip-proofing or waterproofing treatment should be implemented at least on the robot arm, slider arm, etc. that conveys the exposed wafer to from the stage WST to the C/D apparatus (developer portion). In particular, it would be preferable to have a vacuum exhaust path that also provides a liquid tap portion (a small hollow portion or sponge, etc. that collects only the liquid) on the vacuum suction portion formed on the arm to hold the back surface of the wafer, so that there is no problem even if water drops or moisture that has adhered to the back surface of the wafer penetrate.

It is possible to prevent vibration of the optical member that comes into contact with the liquid from being transmitted to the optical group, so it is possible to manufacture a device that prevents deterioration of the pattern image and that has high pattern accuracy.

In addition, through the present invention, it is possible to prevent the penetration of liquid and gas to the image plane side of the projection optical system and to perform exposure processing and measurement processing with high accuracy, so it is possible to expose the substrate well.

What is claimed is:

1. An exposure apparatus comprising:
a projection optical system that includes an optical member that comes into contact with a liquid and an optical group arranged between said optical member and a pattern and that projects an image of said pattern onto a substrate via said liquid,
a first holding member that holds said optical member;
a second holding member that holds said optical group; and
a connection mechanism that connects said first holding member and said second holding member and reduces a transmitted vibration from said first holding member toward said second holding member.

2. An exposure apparatus according to claim 1, wherein said connection mechanism softly connects said first holding member to said second holding member.

3. An exposure apparatus according to claim 1, wherein said connection mechanism absorbs vibration of said first holding member so as to suppress the transmission of vibration from said first holding member to said second holding member.

4. An exposure apparatus according to claim 3, wherein said first holding member holds a lens element having a prescribed optical axis as said optical member that comes into contact with said liquid, and
said first holding member is connected to said second member so as to be movable relative to said second member along said optical axis, and about an orthogonal axis that is orthogonal to said optical axis.

5. An exposure apparatus according to claim 4, wherein said first holding member is connected to said second holding member so as to be tiltable relative to said second holding member.

6. An exposure apparatus according to claim 5, wherein said first holding member is kinematically supported to said second holding member.

7. An exposure apparatus according to claim 1, wherein said connection mechanism includes an elastic member.

8. An exposure apparatus according to claim 7, further comprising
a load reduction mechanism that reduces an action of the load of said first holding member on said connection mechanism.

9. An exposure apparatus according to claim 8, wherein said load reduction mechanism supports the load of said first holding member on said second holding member without contact.

10. An exposure apparatus according to claim 1, further comprising
an image adjustment mechanism that adjusts said image of said pattern, said image projected onto said substrate.

11. An exposure apparatus according to claim 10, wherein said image adjustment mechanism compensates for changes in a quality of said image of said pattern that would otherwise occur in conjunction with fluctuations in said optical member relative to said optical group.

12. An exposure apparatus according to claim 11, further comprising
a first detector that detects a positional relationship between said optical group and said optical member, wherein
said image adjustment mechanism adjusts said image based on detection results of said first detector.

13. An exposure apparatus according to claim 12, wherein said image adjustment mechanism compensates for fluctuations in a positional relationship between said optical member and an exposure surface of said substrate.

14. An exposure apparatus according to claim 13, further comprising:
a second detector that detects the positional relationship between said optical member and said exposure surface of said substrate, wherein
said image adjustment mechanism adjusts said image based on detection results of said second detector.

15. A device manufacturing method that uses an exposure apparatus according to claim 1.

16. An exposure apparatus according to claim 1, wherein said connection mechanism holds said first holding member so as to be displacable relative to said second holding member.

17. An exposure apparatus according to claim 16, wherein said connection mechanism comprises a flexure that connects said first holding member and said second holding member so that said first holding member is displacable relative to said second holding member.

18. An exposure apparatus according to claim 17, wherein said vibration is absorbed by deformation of said flexure.

19. An exposure apparatus according to claim 16, further comprising a first detector that detects the displacement of said optical member.

20. An exposure apparatus, comprising:
   a projection optical system that comprises an optical member coming into contact with a liquid and an optical group disposed between said optical member and a pattern and that projects an image of said pattern onto a substrate via said liquid;
   a ring-shaped member that is provided so as to surround said optical member and has at least one of either a liquid supply port or a liquid recovery port;
   a first seal member that is disposed between and contacts said optical member and said ring-shaped member and that blocks penetration of liquid into a gap formed between said optical member and said ring-shaped member; and
   a substrate stage that holds said substrate and is movable relative to said projection optical system and said ring-shaped member.

21. An exposure apparatus according to claim 20, wherein said first seal member has flexibility.

22. An exposure apparatus according to claim 21, wherein said first seal member has a main unit portion and a contact portion, said main unit portion formed in a ring shape and being attached to one of either said optical member or said ring-shaped member, said contact portion coming into contact with the other and connected to said main unit portion via a hinge portion.

23. An exposure apparatus according to claim 22, wherein at least said contact portion of said first seal member has flexibility.

24. An exposure apparatus according to claim 21, wherein said first seal member includes a sheet-shaped member.

25. An exposure apparatus according to claim 24, wherein said first seal member is liquid repellent.

26. An exposure apparatus according to claim 25, wherein said gap is formed between the side surface of said optical member and the inner side surface of said ring-shaped member, and said side surface and said inner side surface are respectively liquid repellent.

27. An exposure apparatus according to claim 20, further comprising
   a holding member that holds said optical member; and
   a second seal member that blocks the flow of gas between said optical member and said holding member.

28. An exposure apparatus according to claim 20, further comprising:
   a barrel that holds said optical group, and
   a second seal member that blocks a flow of gas between the exterior and the interior space of said barrel.

29. An exposure apparatus according to claim 27, wherein said holding member has a support portion that kinematically supports said optical member, and
   said second seal member is provided in vicinity of said support member.

30. An exposure apparatus according to claim 29, wherein said seal member has a main unit portion that is attached to one of either said optical member or said holding member and a contact portion that that comes into contact with the other and is connected to said main unit portion via a hinge portion.

31. An exposure apparatus according to claim 30, wherein said second seal member is replaceable.

32. An exposure apparatus according to claim 31, wherein said second seal member is replaced according to the exposure light irradiation time.

33. A device manufacturing method that uses an exposure apparatus according to claim 32.

34. An exposure apparatus that exposes a substrate via a liquid, comprising:
   a first holding member that holds an optical member, said optical member being in contact with said liquid;
   a second holding member that holds a plurality of optical members; and
   a connection mechanism that connects said first holding member with said second holding member and vibrationally separates said first holding member and said second holding member.

35. An exposure apparatus according to claim 34, wherein said connection mechanism has an elastic member.

36. An exposure apparatus according to claim 35, wherein said elastic member has a flexure.

37. An exposure apparatus according to claim 34, wherein said connection mechanism holds said optical member in contact with said liquid so that said optical member has at least three degrees of freedom.

38. An exposure apparatus according to claim 37, wherein said optical member is a lens element having an optical axis, and wherein said at least three degrees of freedom include a direction along said optical axis and two directions about two axes orthogonal to said optical axis.

39. An exposure apparatus according to claim 34, wherein said connection mechanism kinematically supports said first holding member relative to said second holding member.

40. An exposure apparatus according to claim 34, wherein said connection mechanism has a load canceling mechanism that reduces the action of the load of said first holding member.

41. An exposure apparatus according to claim 34, wherein said connection mechanism reduces the transmission of vibration between said first holding member and said second holding member.

42. An exposure apparatus according to claim 34, further comprising a first detector that detects a positional relationship between said first holding member and said second holding member.

43. An exposure apparatus according to claim 42, further comprising an image adjustment mechanism that adjusts an image of a pattern based on at least a detection result of said first detector, said image of said pattern being projected onto said substrate.

44. An exposure apparatus according to claim 43, further comprising a second detector that detects a positional relationship between said optical member and an exposure surface of said substrate, and wherein said image adjustment mechanism adjusts said image of said pattern based on a detection result of said second detector.

45. An exposure apparatus according to claim 34, wherein said connection mechanism connects said first holding member to said second holding member so that said optical member can be displaced due to the contact with said liquid.

46. An exposure apparatus according to claim 45, wherein said connection mechanism has a flexure.

47. An exposure apparatus according to claim 46, wherein said connection mechanism absorbs vibration being transmitted via said liquid.

48. An exposure apparatus according to claim 46, wherein said connection mechanism absorbs said vibration by displacement of said optical member.

49. An exposure apparatus according to claim 45, further comprising a first detector that detects the displacement of said optical member.

* * * * *